United States Patent [19]
Hirayama

[11] Patent Number: 5,814,895
[45] Date of Patent: Sep. 29, 1998

[54] STATIC RANDOM ACCESS MEMORY HAVING TRANSISTOR ELEMENTS FORMED ON SIDE WALLS OF A TRENCH IN A SEMICONDUCTOR SUBSTRATE

[75] Inventor: Teruo Hirayama, Kanagawa, Japan

[73] Assignee: Sony Corporation, Tokyo, Japan

[21] Appl. No.: 769,121

[22] Filed: Dec. 19, 1996

[30] Foreign Application Priority Data

Dec. 22, 1995 [JP] Japan ................................ 7-349532
Dec. 25, 1995 [JP] Japan ................................ 7-351052

[51] Int. Cl.$^6$ .............................. H01L 27/11; H01L 29/94
[52] U.S. Cl. ........................ 257/903; 257/206; 257/328; 257/330; 257/334; 257/374; 257/393; 257/397; 257/401; 257/513; 257/904
[58] Field of Search ..................... 257/206, 208, 257/328, 330, 331, 332, 333, 334, 374, 393, 397, 401, 510, 513, 903, 904; 365/154, 205

[56] References Cited

U.S. PATENT DOCUMENTS

| | | | |
|---|---|---|---|
| 4,839,863 | 6/1989 | Soneda | 365/154 |
| 4,910,712 | 3/1990 | Camarota et al. | 365/154 |
| 4,927,777 | 5/1990 | Hsu et al. | 257/374 |
| 5,285,093 | 2/1994 | Lage et al. | 257/330 |
| 5,307,142 | 4/1994 | Corbett et al. | 365/154 |
| 5,324,973 | 6/1994 | Sivan | 257/393 |

*Primary Examiner*—Carl W. Whitehead, Jr.
*Assistant Examiner*—Alice W. Tang
*Attorney, Agent, or Firm*—Hill & Simpson

[57] ABSTRACT

In a static random access memory (SRAM), a memory cell ratio is increased without deteriorating an integration degree of this SRAM. The static random access memory is arranged by: trenches formed in a semiconductor substrate and an insulating layer for isolating elements within a memory cell forming region; one pair of word transistors; one pair of driver transistors for constituting a flip-flop by forming channel regions of the driver transistors in side surfaces of the trenches and by cross-connecting gate electrodes thereof and drain electrodes thereof at one pair of input/output terminals of the flip-flop; and one pair of word transistors connected between the one pair of input/output terminals of the flip-flop and a bit line.

11 Claims, 23 Drawing Sheets

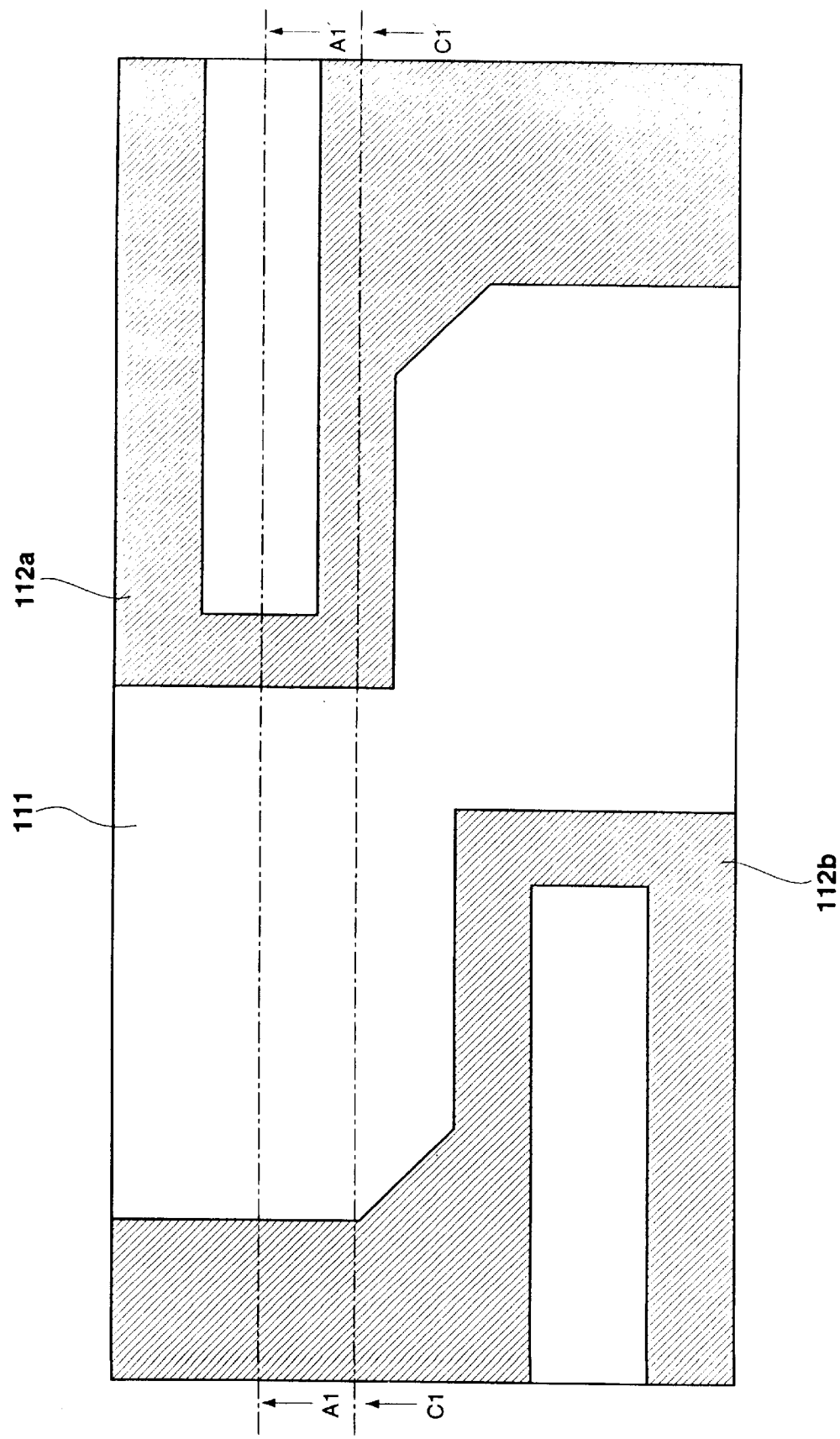

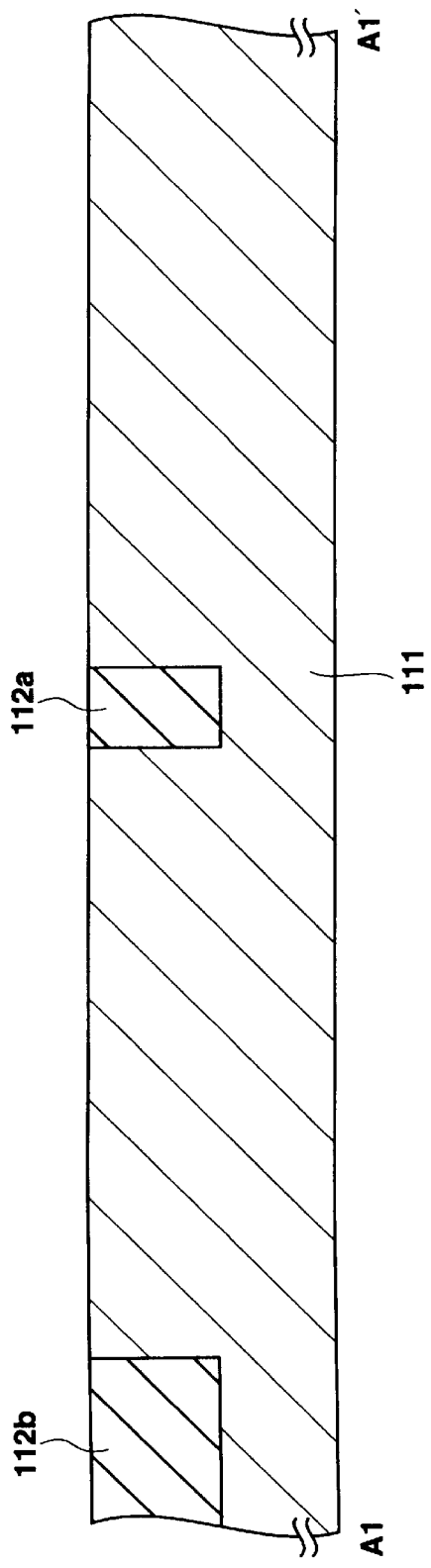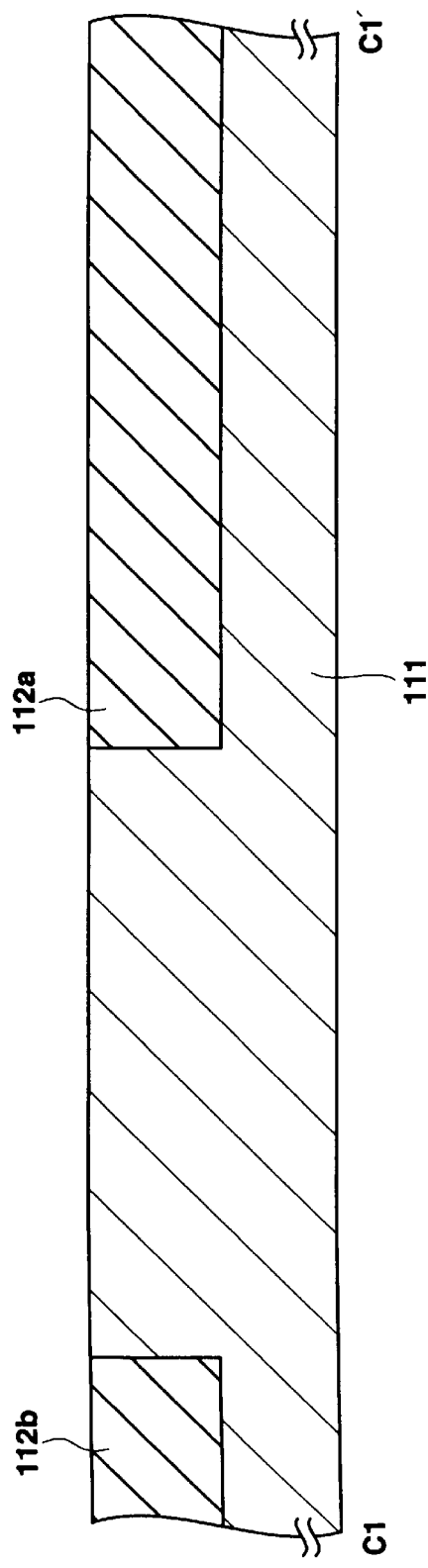

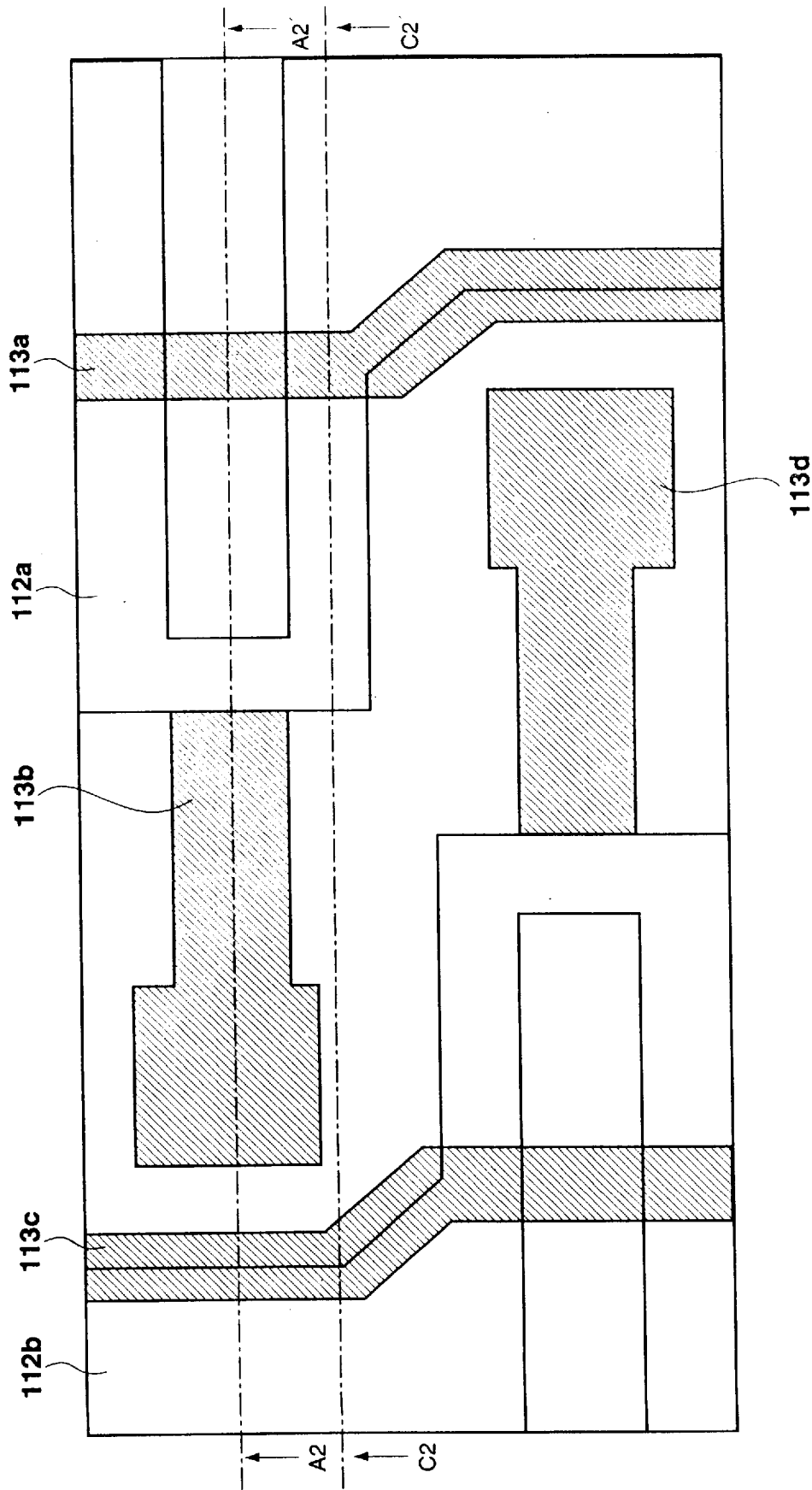

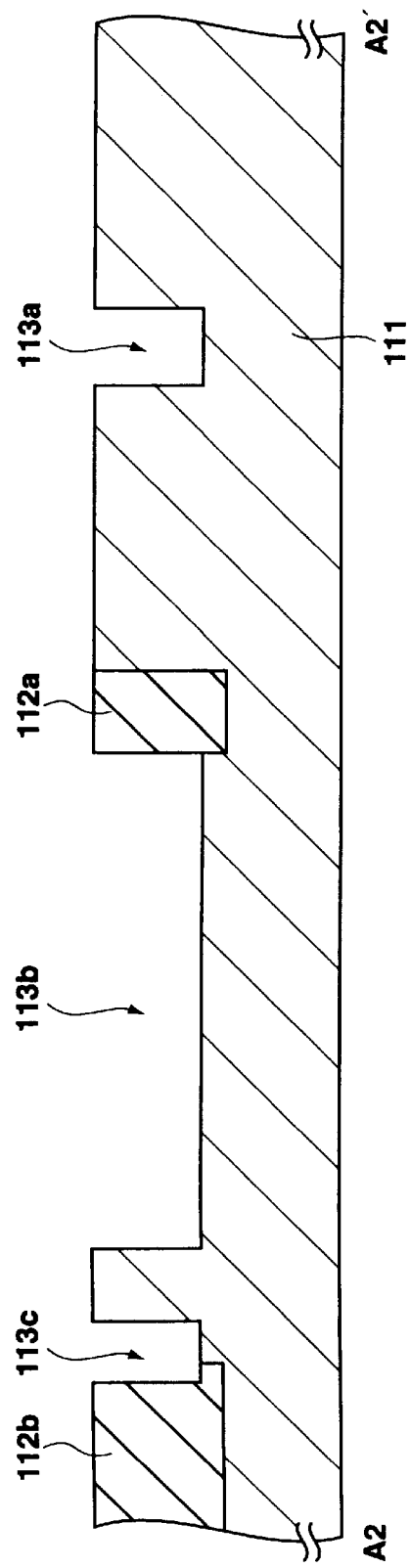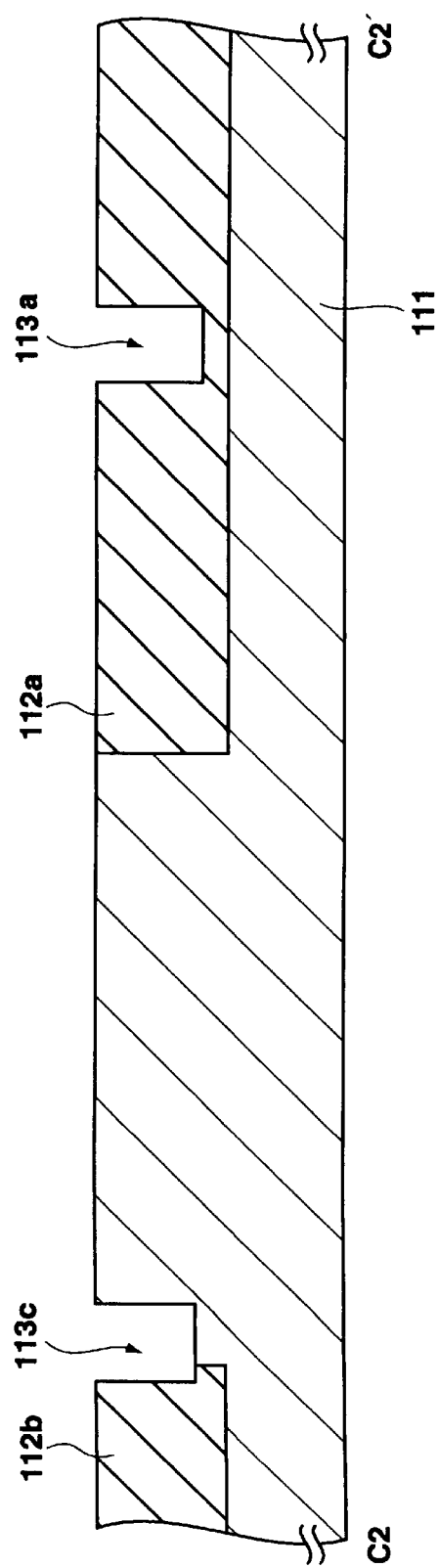

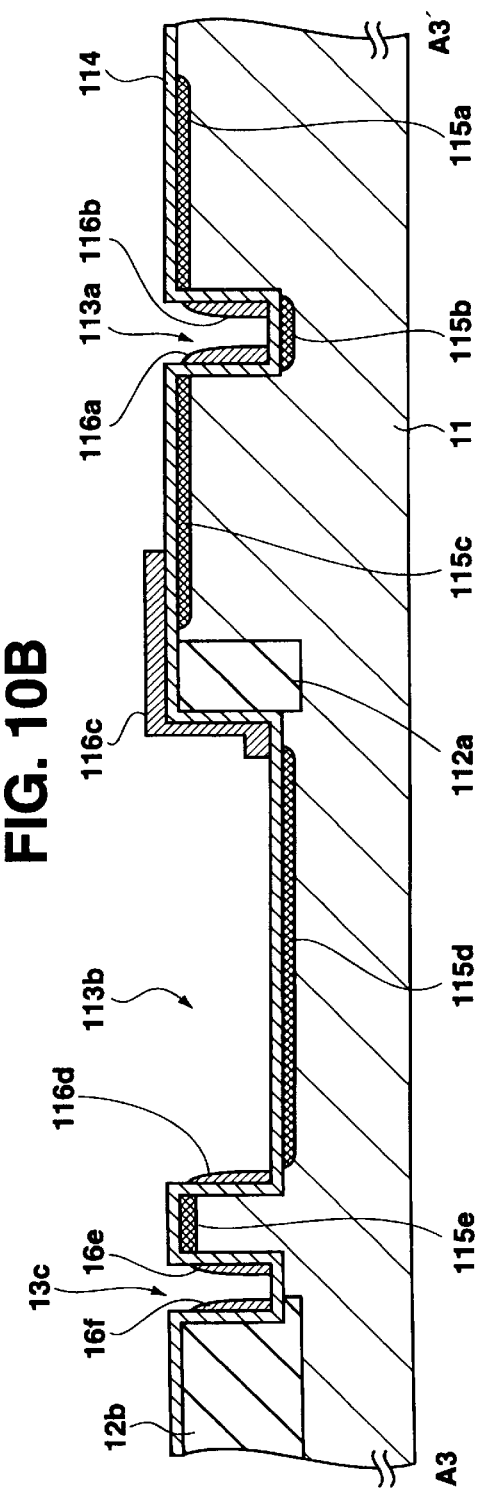
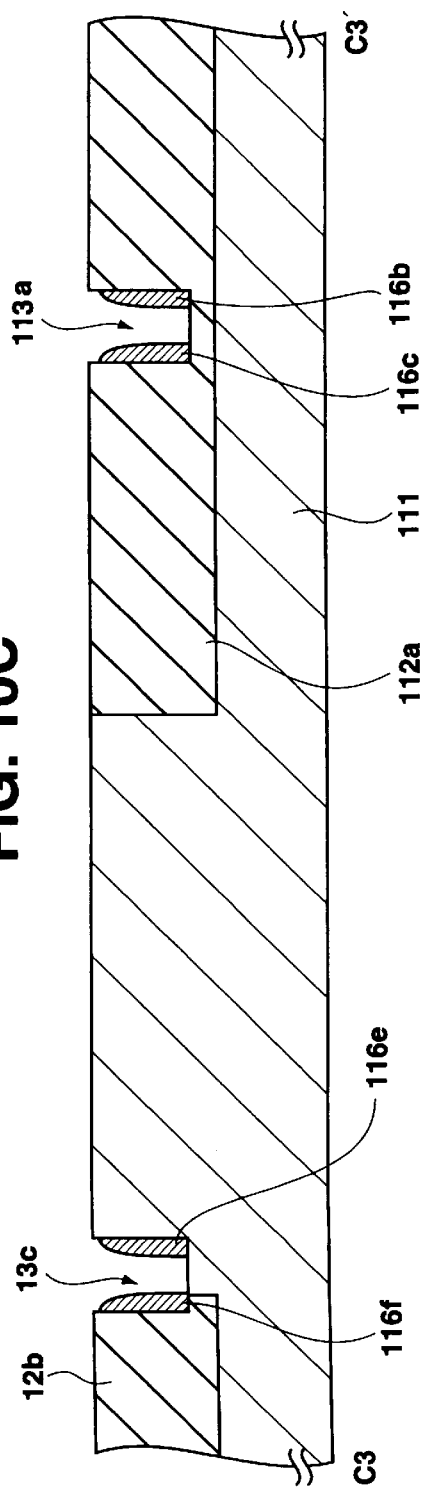

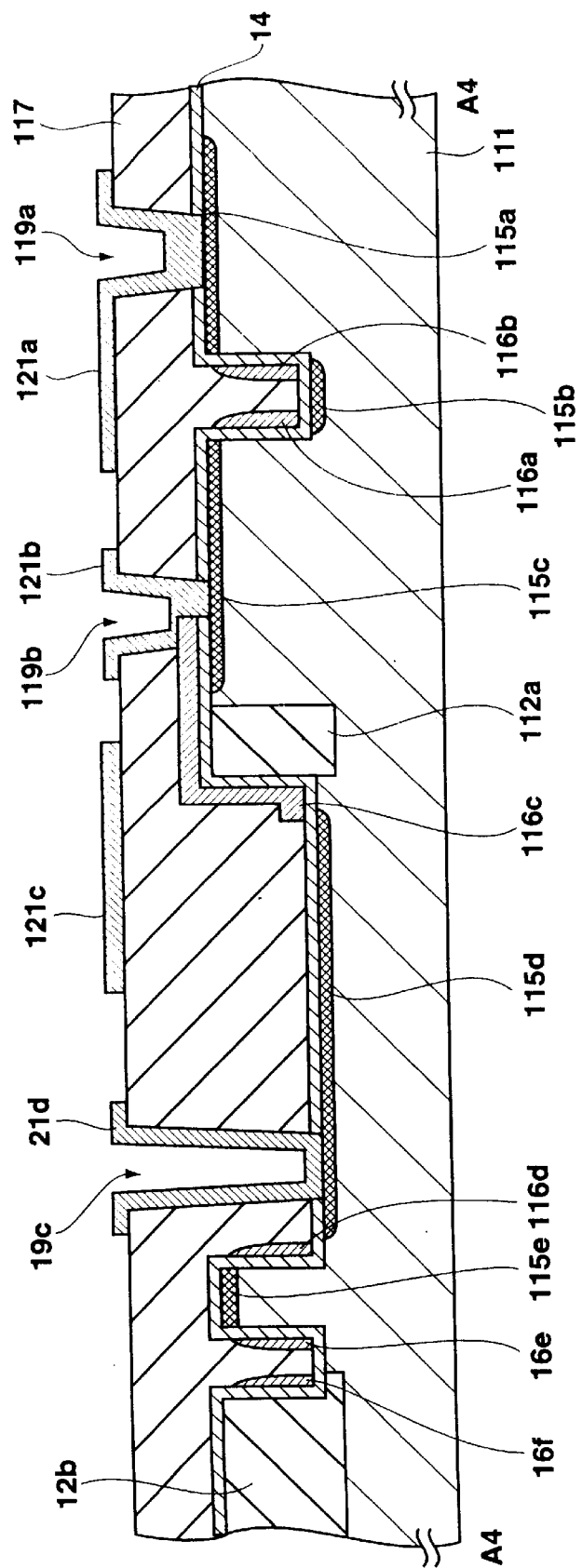

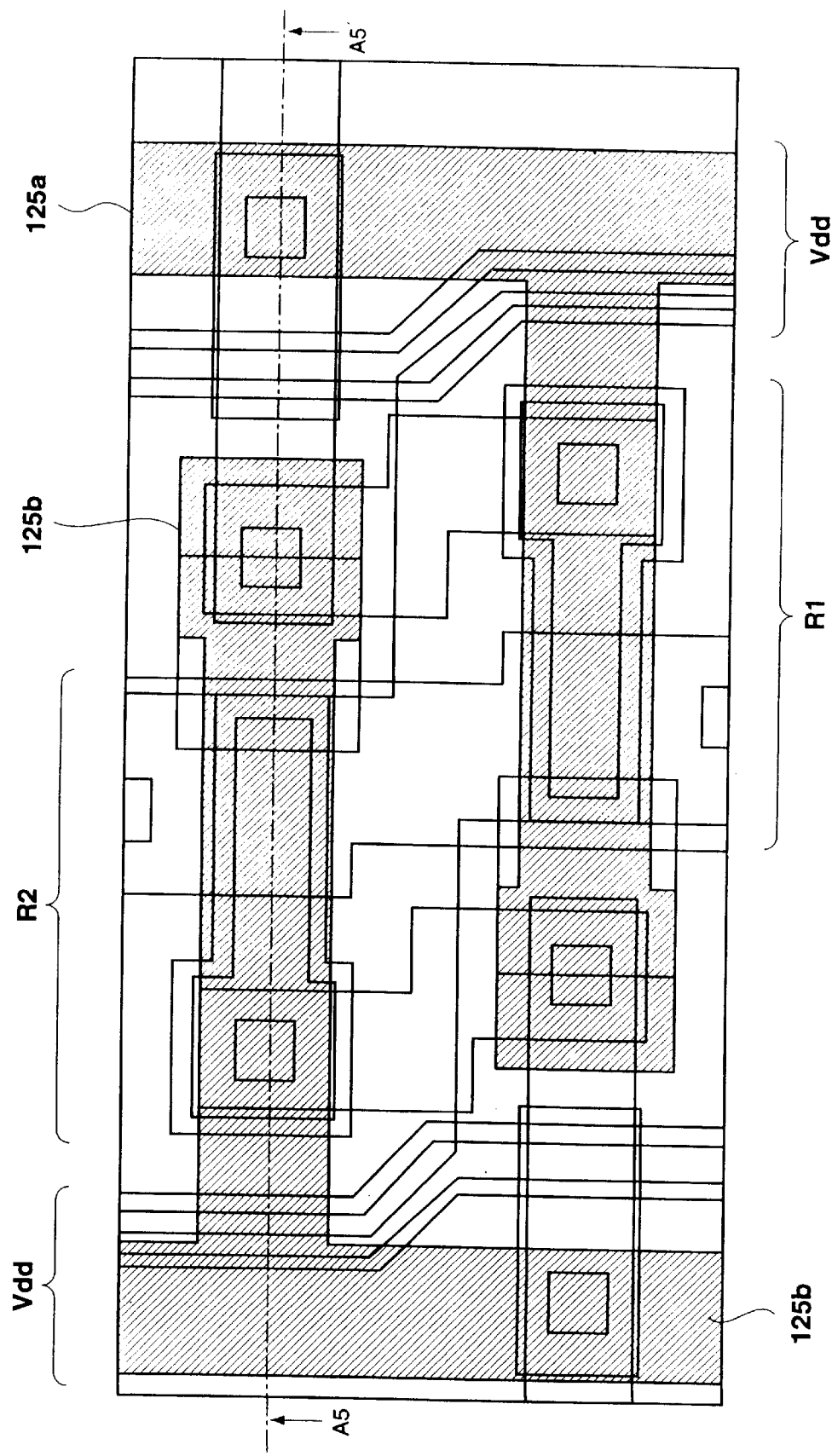

STATIC RANDOM ACCESS MEMORY HAVING TRANSISTOR ELEMENTS FORMED ON SIDE WALLS OF A TRENCH IN A SEMICONDUCTOR SUBSTRATE

BACKGROUND OF THE INVENTION

The present invention generally relates to a static random access memory (SRAM) and a method for manufacturing a SRAM. More specifically, the present invention is directed to an SRAM having better noise resistance characteristics and suitable for a high integration process.

In general, an SRAM is constructed of a flip-flop made of one pair of word transistors and one pair of driver transistors. The word transistors have a gate connected to a word line, and a source-to-drain path, one end of which is connected to a bit line. Drains and gates of the driver transistors are cross-connected to each other at one pair of input/output terminals. The other end of the source-to-drain path of the word transistors is connected to the above-described one pair of input/output terminals. Moreover, generally speaking, load elements having high resistance values are connected between the respective input/output terminals and a power source so as to hold data.

As is known in the SRAM device field, there is a certain possibility that data stored in a memory cell is destroyed due to noise and an unbalanced threshold value (Vth) of this memory cell. The data holding capability of this SRAM will depend upon a ratio (namely, memory cell ratio) of a driveability of driver transistors to that of word transistors. Assuming now that a channel width of a driver transistor is "Wd", a channel length of this driver transistor is "Ld", a channel width of a word transistor is "Ww", and a channel length of this word transistor is "Lw", a memory cell ratio "R" is expressed by the following formula:

$$R=(Wd/Ld)/(Ww/Lw).$$

In connection with this formula, such a demand is made that data can be hardly destroyed during data reading operation by increasing the memory cell ratio R, and also the ratio of the current driveability of the driver transistors to that of the word transistors. However, in general, since these word transistors and driver transistors are formed on the semiconductor substrate in a plane (two-dimensional) manner, when the channel widths of the driver transistors are made wide so as to increase the driveability of the driver transistors, it is rather difficult to manufacture the memory cell in a high integration degree. Conversely, when the channel widths of the word transistors are made narrow, the threshold value (Vth) of the word transistors is increased due to the narrow channel effect, there is a certain limitation in narrowing of the channel widths.

SUMMARY OF THE INVENTION

An object of the present invention is to obtain an SRAM having a high data holding capability without deteriorating integration degrees of this SRAM, while increasing a memory cell ratio.

To achieve the above-described object, an SRAM, according to the present invention, is featured by that in an SRAM equipped with word transistors and driver transistors in each of memory cells, a recess corresponding to driver transistors of each memory cell is formed in a major surface of an Si substrate, and gate electrodes of the driver transistors are arranged on a side surface of the recess.

In an SRAM according to a first aspect of the present invention, the gate electrodes of the driver transistors are arranged on the side surface of the recess, so that the channel widths of the driver transistors can be made wide, as compared with the dimension of the diffusion layer of the driver transistors. As a result, the current driveability of the driver transistors can be set to be large, and also the noise margin of the memory cell can be increased.

The gate electrodes of the driver transistors may be preferably formed as a first layer of wiring layers. In this case, the efficiency of arranging the sources and the drains of the driver transistors can be increased, which are formed on the bottom portion of the recess and the major surface of the substrate located adjacent to this recess.

Also, the gate electrode of each driver transistor is preferably connected to the drain of another driver transistor by employing a second layer of the wiring layers. The arrangement of the wiring layers can be further made better.

An SRAM, according to a second aspect of the present invention, is featured by comprising trenches formed in a semiconductor substrate and an insulating layer for isolating elements in a memory cell forming region, one pair of word transistors formed in side surfaces of the trenches via a gate insulating film, and one pair of driver transistors formed in side surfaces of the trenches via a gate insulating film.

Furthermore, in the above-described SRAM of the second aspect of the present invention, the trenches are preferably formed in such a manner that the depths of the trenches do not exceed the depth of the elements isolation insulating layer, and the gate electrodes of the word transistors as well as the driver transistors are arranged on the inner side surfaces of the trenches.

Moreover, in an SRAM according to a third aspect of the present invention, a driver transistor has such a drain region and such a source region. That is, an impurity diffusion layer formed in a bottom portion of a trench where this driver transistor is formed is used as the drain region, and an impurity diffusion layer formed in a surface of a semiconductor substrate of the portion where this driver transistor is formed is used as the source region.

In addition, in the SRAM according to the third aspect of the present invention, a word transistor is preferably arranged by series-connecting two transistors in which an impurity diffusion layer formed in a bottom portion of trenches where this word transistor is fabricated is used as a source, and a side surface shaped conductive layer which is commonly used with the drain region of the driver transistor and is formed in both inner surfaces of the trenches of this portion, is used as each of gate electrodes.

Moreover, in the SRAM according to the third aspect of the present invention, the gate electrodes of the driver transistors and the gate electrodes of the word transistors are preferably constituted by conductive layers formed in the same manufacturing step.

A method for manufacturing the above-described SRAM corresponds to a manufacturing method of an SRAM containing one pair of word transistors and one pair of driver transistors. This SRAM manufacturing method is comprised of the steps of forming trenches having preselected depths in a semiconductor substrate and an insulating layer for isolating elements within a memory cell region; selectively forming gate insulating films on inner side surfaces of the formed trenches and the semiconductor substrate; selectively forming impurity diffusion layers which will constitute a source-to-drain region, near bottom portions of the formed trenches and a surface of the semiconductor substrate; and selectively forming a side surface shaped conductive layer which constitutes a gate electrode of a driver transistor and a gate electrode of a word transistor in the inner side surfaces of the trenches.

Moreover, the above-described SRAM manufacturing method of the present invention, is further comprised of the steps of: forming an interlayer insulating film over the entire surface, after forming the side surface shaped conductive layer; and forming a conductive layer on the interlayer insulating film, the conductive layer constituting a drain deriving electrode of one driver transistor within the one pair of driver transistors, and also a gate electrode deriving electrode of the other driver transistor.

BRIEF DESCRIPTION OF THE DRAWINGS

FIG. 8A is a plane overlapped diagram of the memory cell represented in FIG. 4 at a first step;

FIG. 8B is a sectional view for showing the memory cell, taken along a line A1 to A1' of FIG. 8A;

FIG. 8C is a sectional view for indicating the memory cell, taken along a line C1 to C1' of FIG. 8A;

FIG. 9A is a plane overlapped diagram of the memory cell represented in FIG. 4 at a second step;

FIG. 9B is a sectional view for showing the memory cell, taken along a line A2 to A2' of FIG. 9A;

FIG. 9C is a sectional view for indicating the memory cell, taken along a line C2 to C2' of FIG. 9A;

FIG. 10B is a sectional view for showing the memory cell, taken along a line A3 to A3' of FIG. 10A;

FIG. 10C is a sectional view for indicating the memory cell, taken along a line C3 to C3' of FIG. 10A;

FIG. 11B is a sectional view for showing the memory cell, taken along a line A4 to A4' of FIG. 11A;

FIG. 12A is a plane overlapped diagram of the memory cell represented in FIG. 4 at a fifth step.

DETAILED DESCRIPTION OF THE PREFERRED EMBODIMENTS

Figure 1:
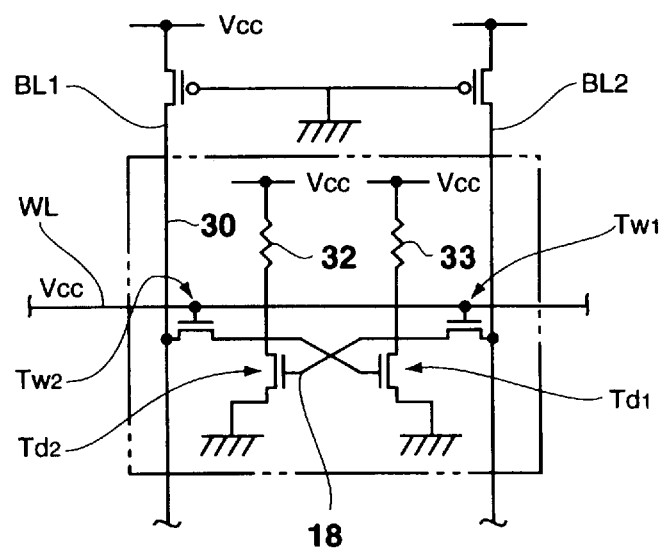
FIG. 1 is an equivalent circuit diagram of a high resistance load type SRAM memory cell to which the present invention is applied.

Referring now to drawings, the present invention will be described in detail. FIG. 1 is an equivalent circuit diagram for indicating a high resistance load type memory cell to which the present invention is applied.

Date transferred from one pair of bit lines $BL_1$, $BL_2$ are transferred via one pair of word transistors Tw1, Tw2 to gate electrodes of driver transistors Td2, Td1 corresponding thereto, and then are stored into a flip-flop constituted by the driver transistors Td1, Td2 and high resistance loads 32, 32. Also, the data stored in this flip-flop are transferred from the word transistors Tw1, Tw2 via the corresponding bit lines $BL_1$, $BL_2$ to be read by a sense amplifier (not shown).

Figure 2A:
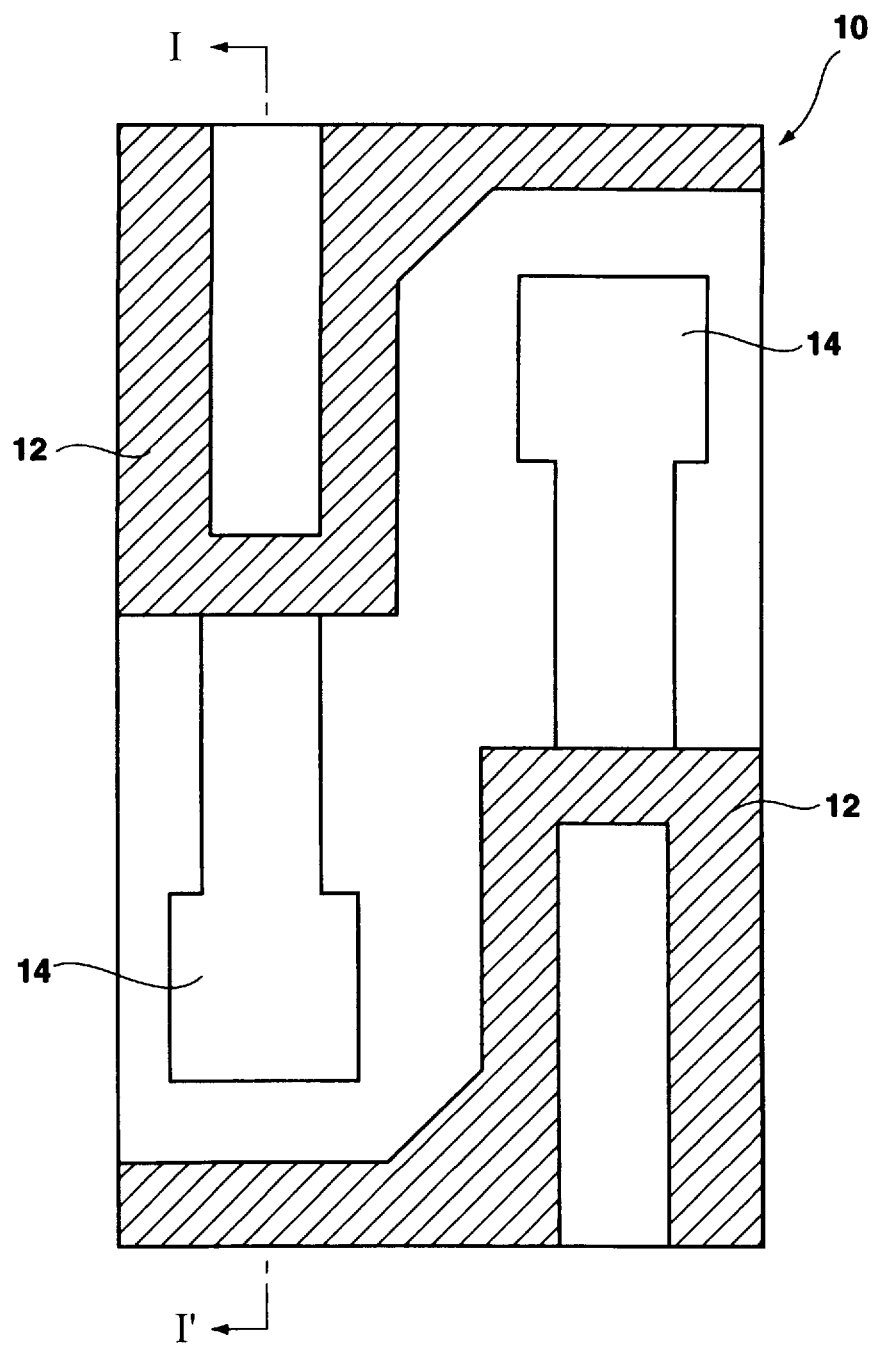
FIG. 2A to FIG. 2E are plane arrangement diagrams for representing the SRAM memory cell shown in FIG. 1 in accordance with the manufacturing step.
Figure 2B:
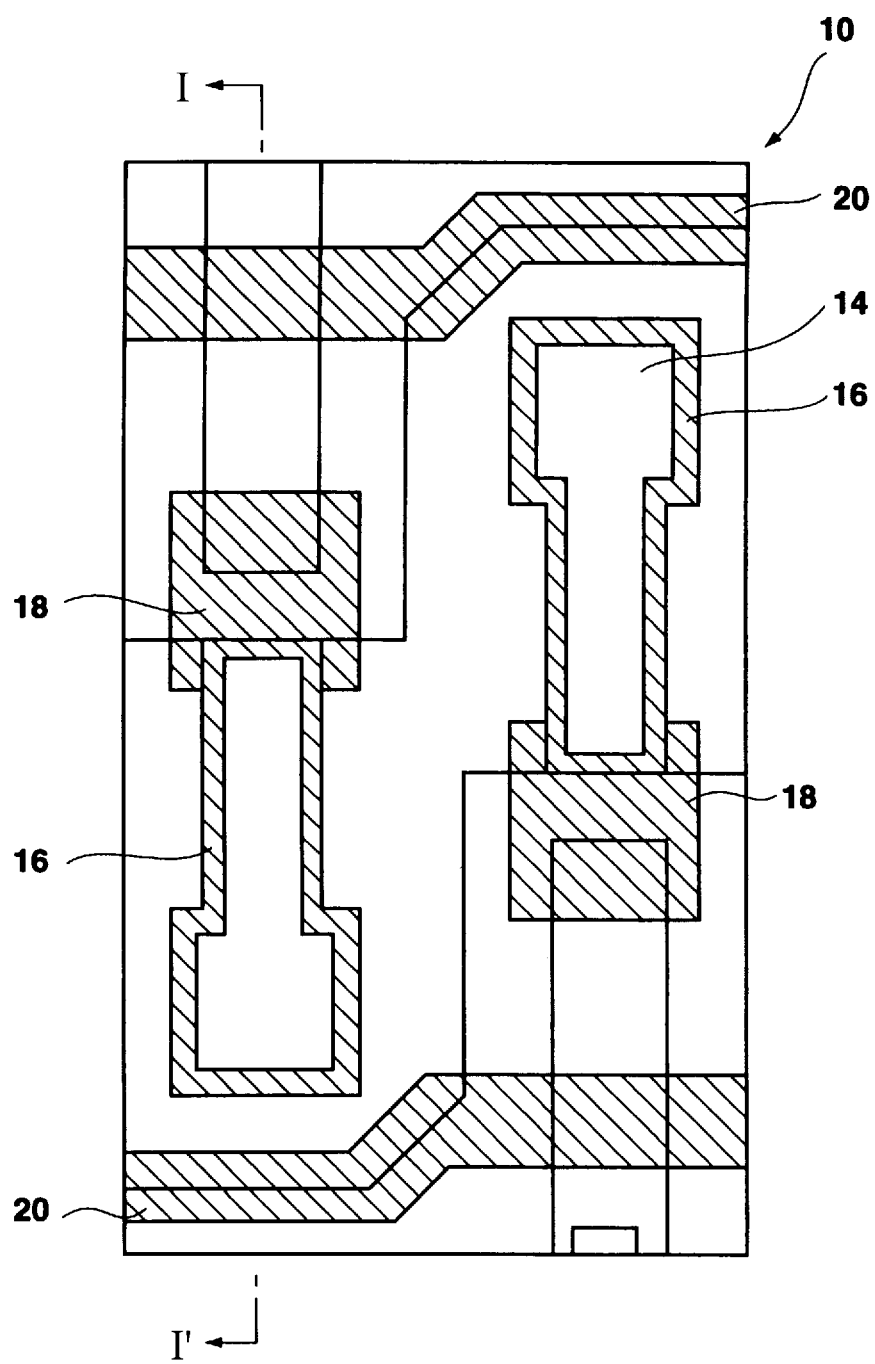
Figure 2C:
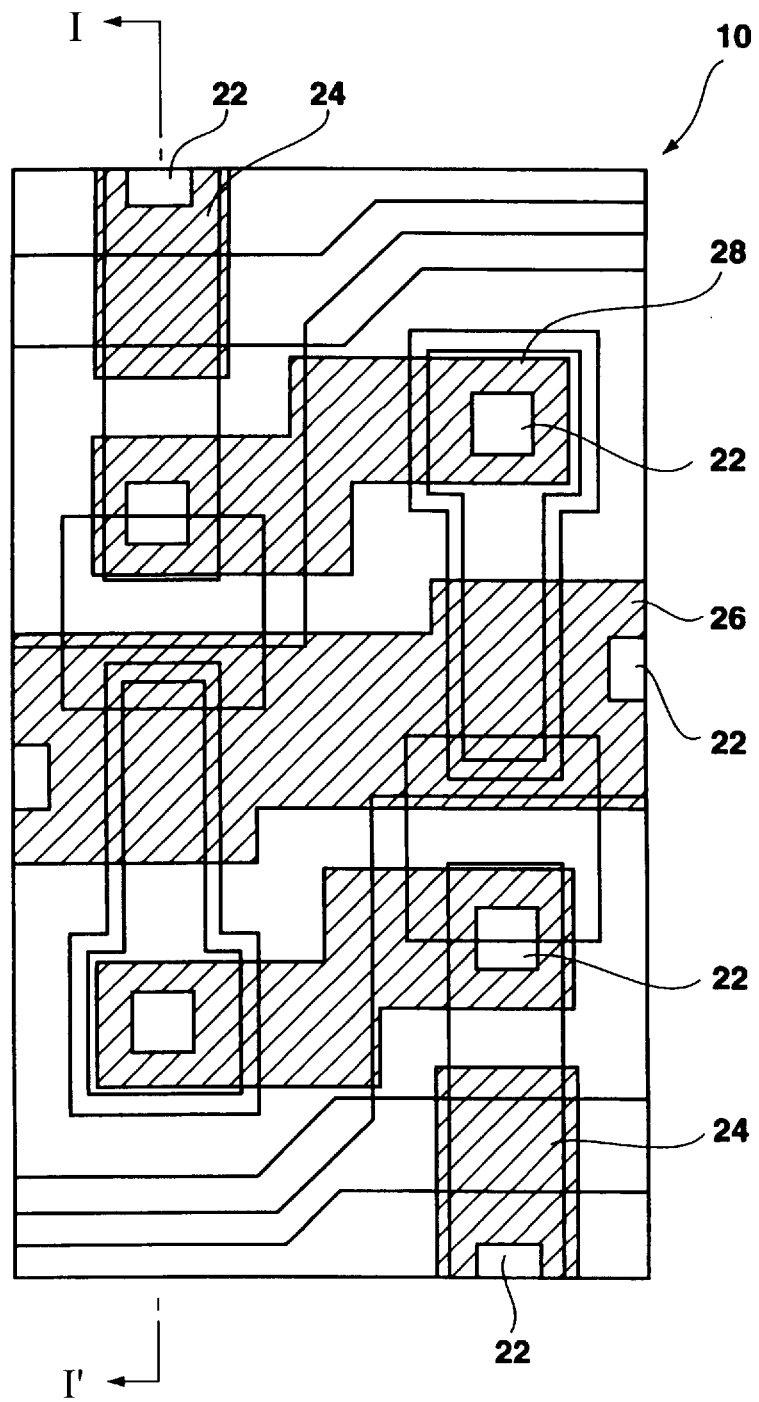
Figure 2D:
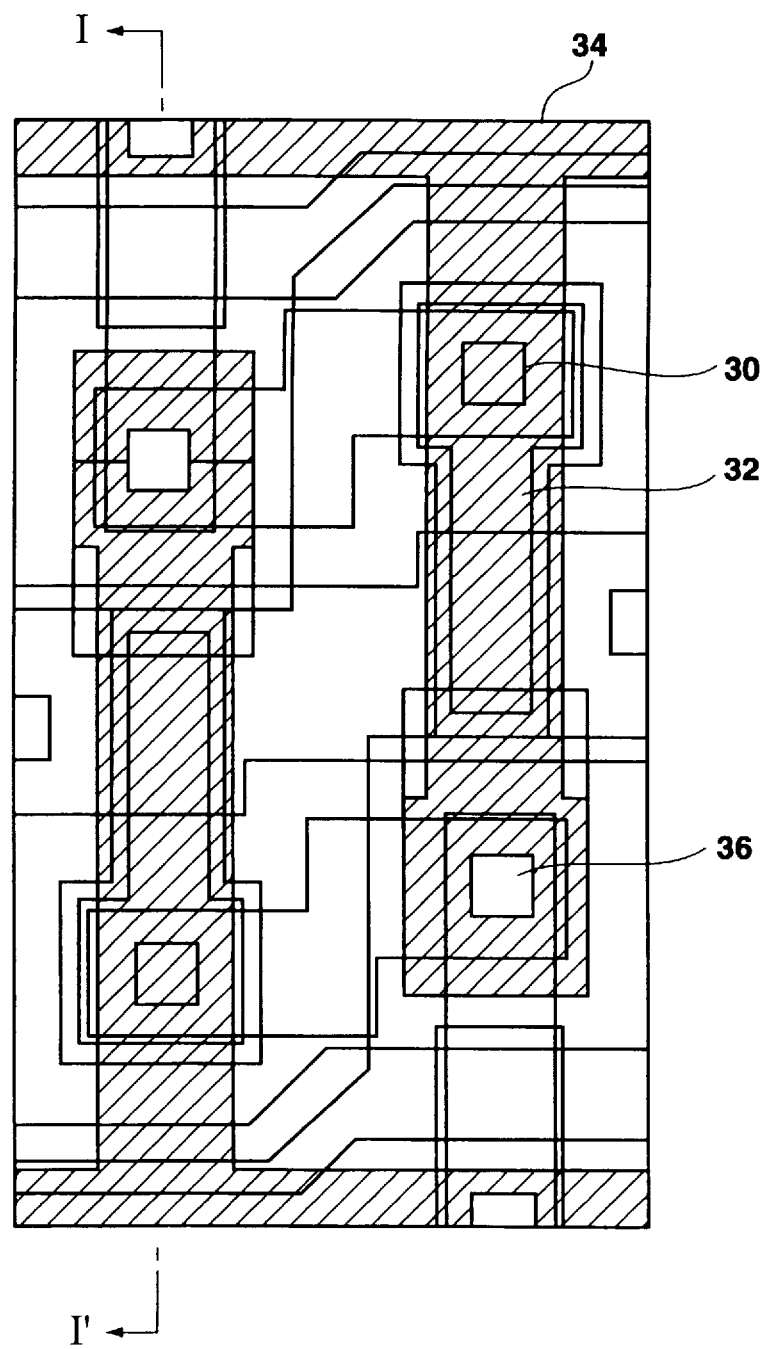
Figure 2E:
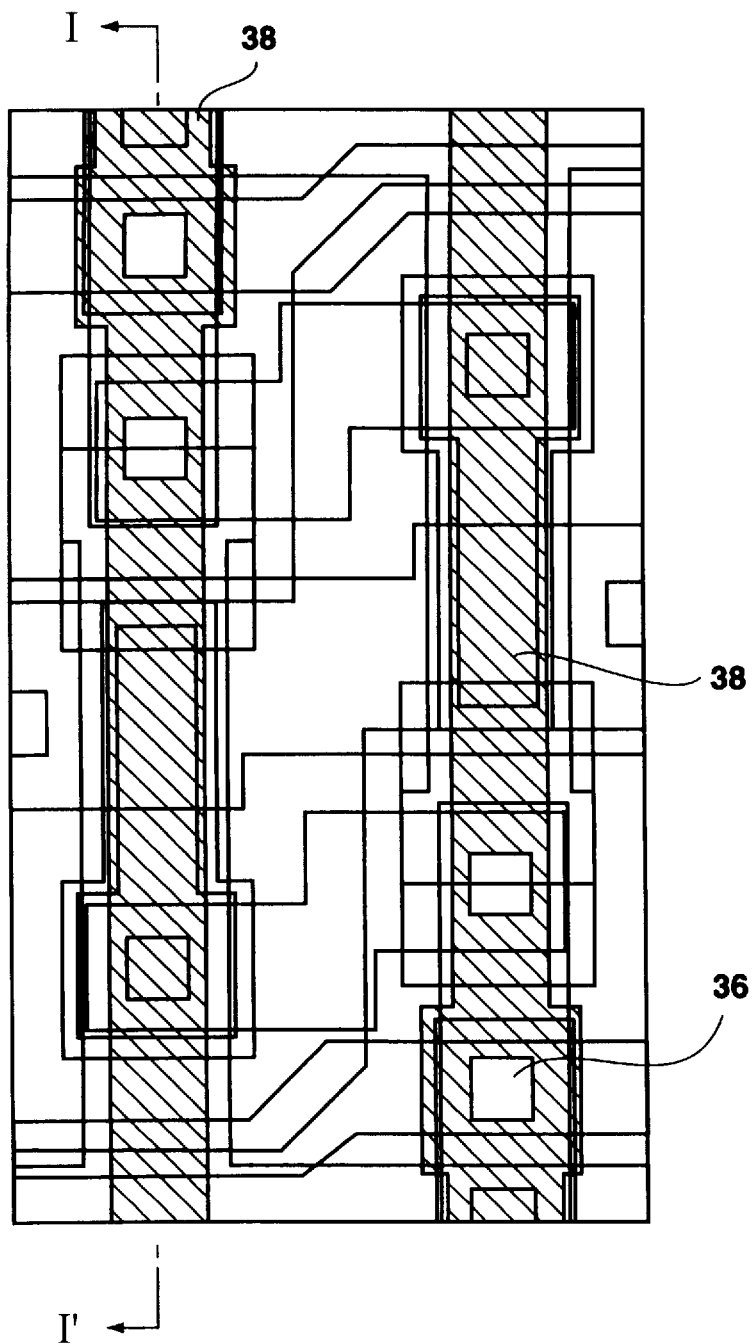
Figure 3A:
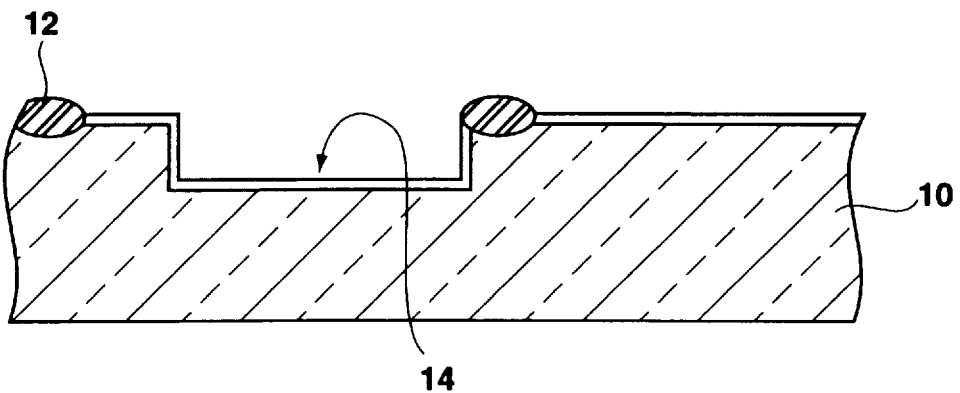
FIG. 3A to FIG. 3E are sectional views of the SRAM, taken along a line A–A' of FIG. 2A to FIG. 2C.
Figure 3B:
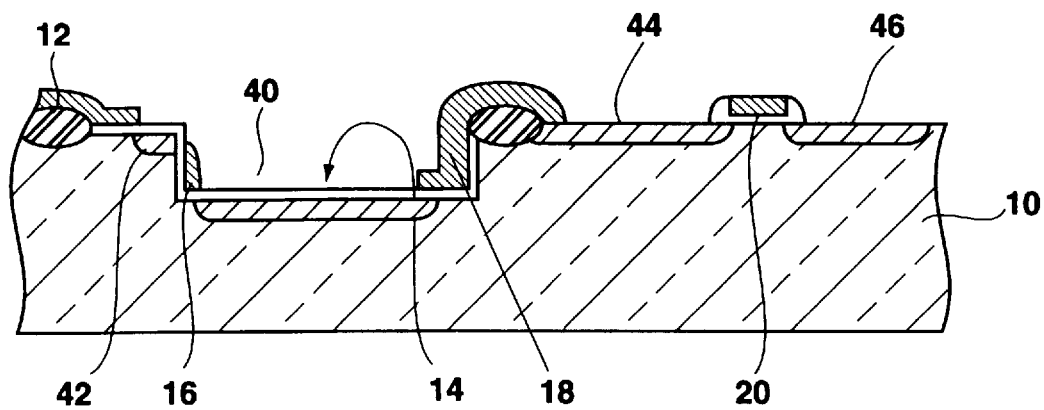
Figure 3C:
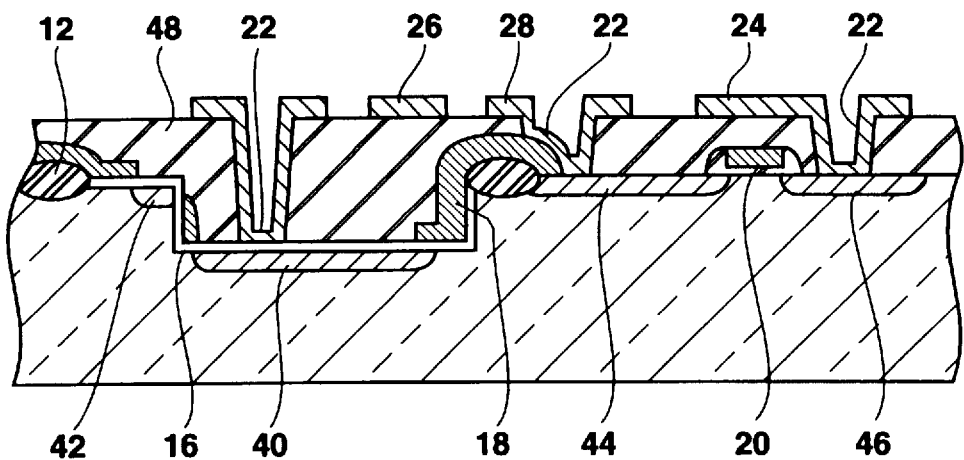
Figure 3D:
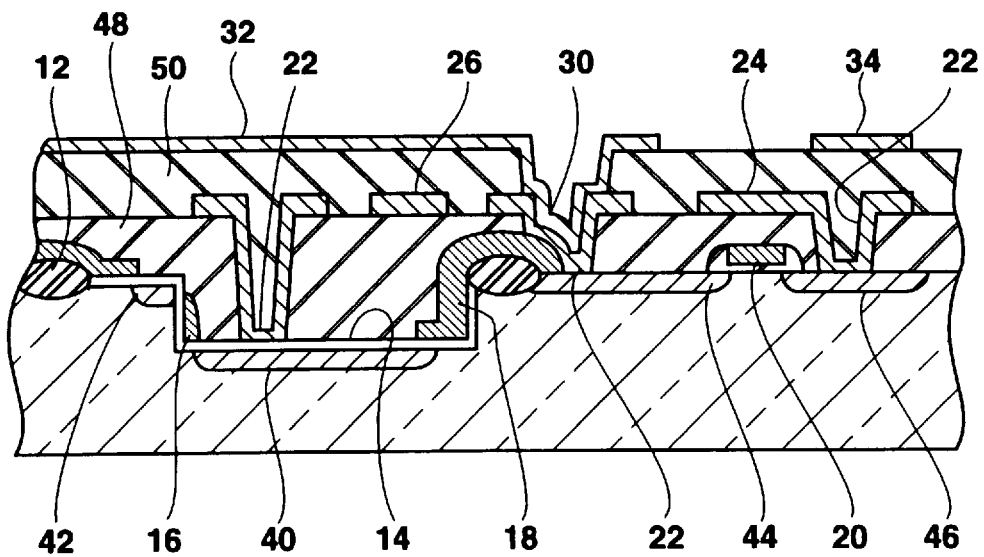
Figure 3E:
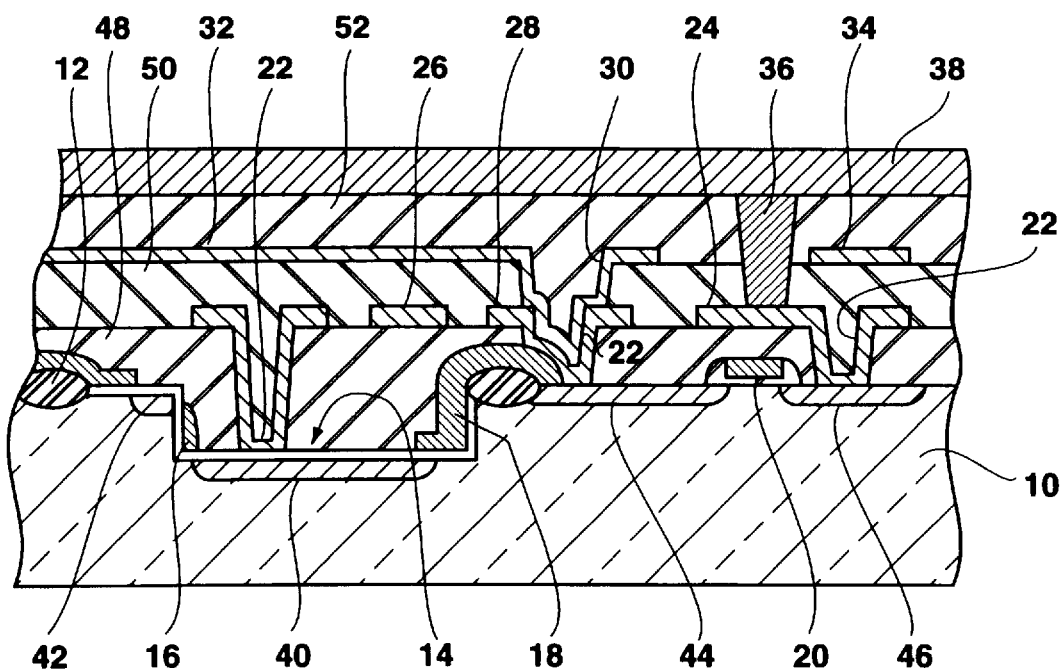

FIG. 2A to FIG. 2E represent plane arrangements of the above-described memory cell in the respective manufacturing steps. FIG. 3A to FIG. 3E are sectional views for showing this memory cell, taken along a line A–A' of FIG. 2A to FIG. 2E. In FIG. 3E, a recess 14 formed in an Si substrate 10 in such a manner that this recess 14 is located one step lower than a major surface of the substrate 10. A drain diffusion layer 40 of the driver transistor is formed in a flat bottom portion of this recess 14. A gate electrode 16 for constituting a first layer wiring pattern is formed on a side surface of the recess 14, and this first layer wiring pattern is formed completely around this side surface. The gate electrode 16 is insulated via a gate oxide film from a peripheral portion of the drain diffusion layer 40. A source diffusion layer 42 of the driver transistor is arranged on a shoulder portion of the major surface of the substrate located adjacent to the recess 14. This source diffusion layer 42 is located opposite to the drain diffusion layer 40 via the gate electrode 16 having the side surface structure. With employment of the above-explained structure, the channel of the driver transistor is substantially directed to the vertical direction with respect to the major surface of the substrate.

The drain diffusion layer 40 of the driver transistor is connected to a gate electrode of the other driver transistor (not shown) via a polysilicon contact 22 for constituting a second wiring pattern. The gate electrode 16 of the driver transistor is connected to a drain diffusion layer 44 of the word transistor via a conducting wiring portion 18 which is formed as a first layer wiring pattern provided as the same layer as this gate electrode 16. This drain diffusion layer 44 is connected to a high resistance load 32 formed in a third layer wiring layer via polysilicon contacts 22 and 30 for constituting a second layer wiring pattern and this third layer wiring pattern. Also, this drain diffusion layer 44 is connected to another drain diffusion layer of the other driver transistor (not shown), which is similarly formed in the recess of the major surface of the substrate. A source diffusion layer 46 of the word transistor is formed in the major surface of the substrate, which is located adjoining the drain diffusion layer 44. This source diffusion layer 46 is located opposite to the drain diffusion layer 44 via a word line 20 for constituting the first wiring layer. The source diffusion layer 46 of the word transistor is connected via the polysilicon contact 22 and the contact 36 for the second layer wiring pattern to an aluminium wiring pattern 38 corresponding to a fourth layer wiring pattern for constituting a bit line.

In the above-described structure, the gate electrode 16 of the driver transistor is substantially formed vertically along the inner side surface of the recess 14. Accordingly, since the channel width of the driver transistor can be enlarged up to the width capable of surrounding one complete peripheral portion of the inner side surface, the channel width Wd of the driver transistor can be made sufficiently large (wide) without increasing the area occupied by the driver transistor, and therefore without deteriorating the integration degree of the SRAM, so that the memory cell ratio can be set to a large value. As a result, it is possible to increase the noise margin.

Next, the manufacturing step of the SRAM according to the present invention will now be described with reference to the drawings. First, a LOCOS oxide film 12 for isolating elements is formed on the major surface of the substrate 10. Subsequently, one pair of recess 14 are formed on the major surface of the substrate 10 by way of the etching treatment in such a manner that a portion for forming the drain diffusion layer is partially widened. As a result, the structures shown in FIG. 2A and FIG. 3A are obtained.

Subsequently, the polysilicon layer for constituting the first wiring pattern is formed by way of the CVD method, and is further patterned by way of the photolithography method to thereby form the gate electrode 16 on the inner side surface of the recess 14, and at the same time, to form the conducting line portion 18 and the word line 20 from this gate electrode 16. Next, to form the word line 20 as the side surface structure, the insulating layer is formed and etched back to thereby obtain the structures shown in FIG. 2B and FIG. 3B.

A first interlayer insulating film is formed on the first wiring pattern, and then is planar-processed by way of the reflow process. Contact openings for the respective diffusion layers of the driver transistor and the word transistor are formed in the first interlayer insulating film 48. Subsequently, the polysilicon layer for constituting the second layer wiring pattern is formed on the first interlayer insulating film 48 in a similar manner by the CVD method. The second layer wiring is patterned in which the contact hole 22, the conducting line portion 24, and the ground line 26 are formed so as to be connected with the substrate. At the same time, the connection between the previously formed conducting line portion 18 of the gate electrode 16 of each of the driver transistors and the drain diffusion layer 40 of the other driver transistor may form a latitude line 28. As a result, structures shown in FIG. 2C and FIG. 3C are obtained. The conducting wiring line portion 24 from the source diffusion layer 46 of the word line is employed so as to be connected with a bit line which will be then formed.

Furthermore, a second interlayer insulating film 50 is formed, and then planar-processed by way of the reflow process, and an opening for a through hole is formed in the planar-processed second interlayer insulating film 50. Thereafter, the polysilicon layer for constituting the third layer wiring is formed and patterned, so that a through hole with the second layer wiring pattern, a high resistance element 32, and a power supply line 34, and the like are formed. As a consequence, the structures indicated in FIG. 2D and FIG. 3D are obtained. Furthermore, the third interlayer insulating film 52 is formed on the resultant structures shown in FIG. 2D and FIG. 3D, and then planar-processed by way of the reflow process, and furthermore, the openings for the second and third interlayer insulating films are formed. Thereafter, the sputtering of A1 for constituting the fourth wiring layer and the patterning treatments are carried out, so that a bit contact 36 and a bit line 38 are formed. Thus, the structures shown in FIG. 2E and FIG. 3E are obtained. The bit contact 36 is formed on the conducting line portion 24, and is connected via this conducting line portion 24 to the source 46 of the word transistor. Furthermore, a surface protection layer is formed over the entire structure, so that manufacturing of this SRAM is accomplished.

In accordance with the above-described structure of this first embodiment, since the gate electrode of the driver transistor is formed in the inner side surface of the recess, the channel width of the driver transistor can be made sufficiently large, as compared with the occupied area of the driver transistor. Thus, the ratio of the current driveability of the driver transistor to the current driveability of the word transistor can be increased, and the noise margin of the SRAM can be increased. In other words, the occupied area of the driver transistor can be reduced while maintaining the current driveability of the driver transistor, and also higher integration of the SRAM can be realized.

Furthermore, an SRAM according to another preferred embodiment of the present invention will now be explained with reference to the drawings.

Figure 4:
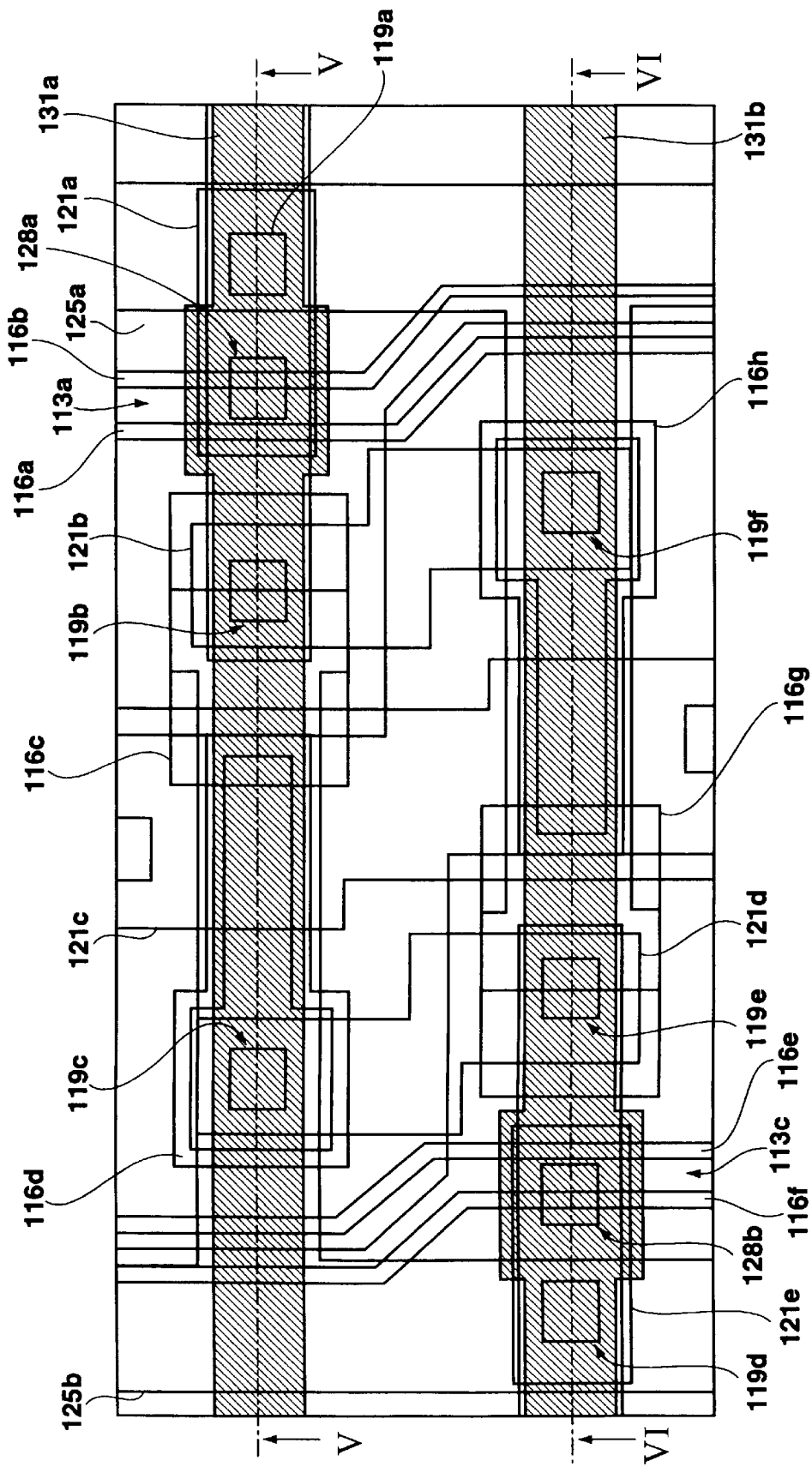
FIG. 4 is an illustration in which plane patterns are overlapped, according to another embodiment of the present invention.
Figure 5:
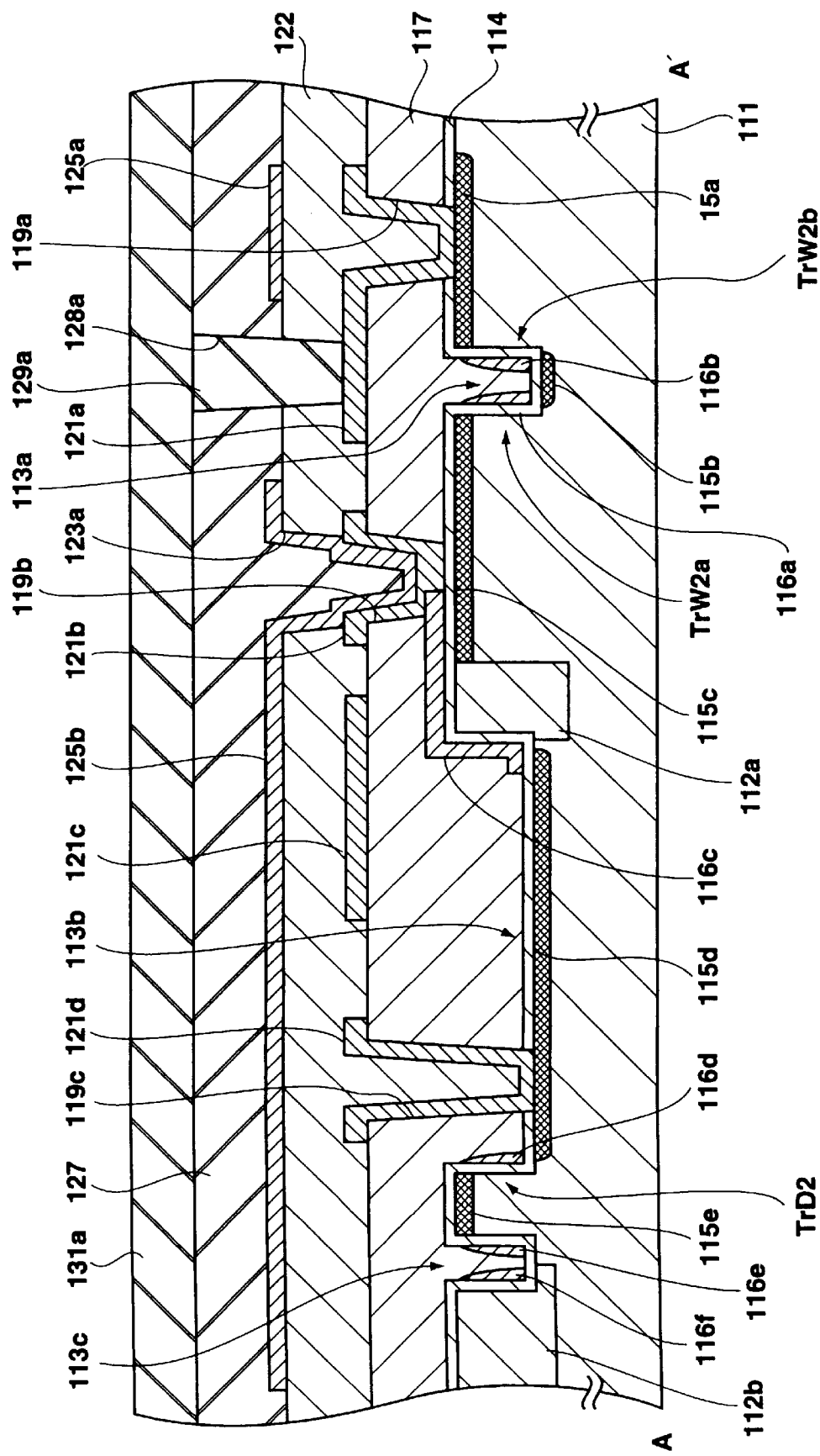
FIG. 5 is a sectional view for showing the plane patterns, taken along a line A–A' of FIG. 4.
Figure 6:
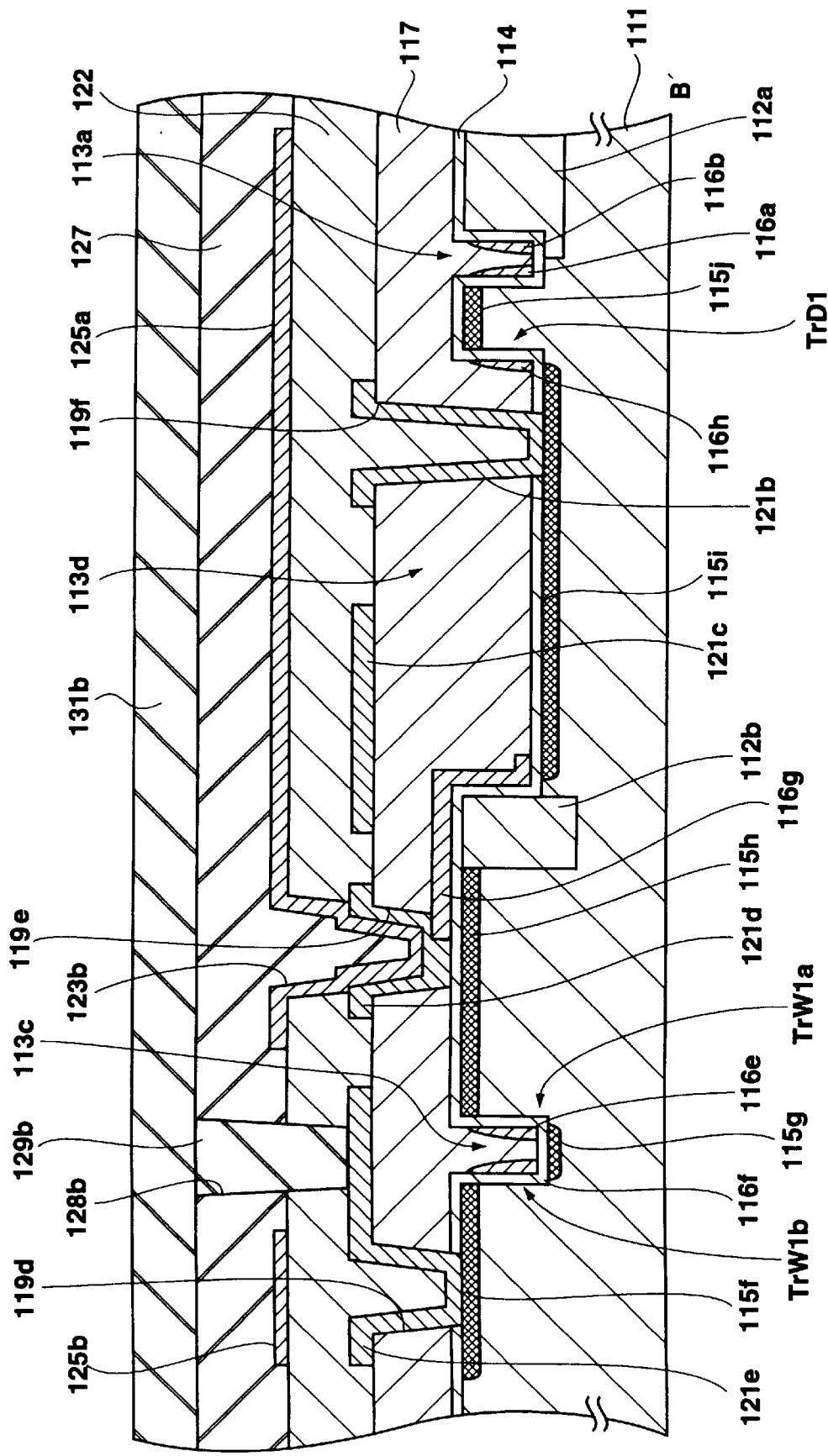
FIG. 6 is a sectional view for indicating the plane patterns, taken along a line B–B' of FIG. 4.
Figure 7:
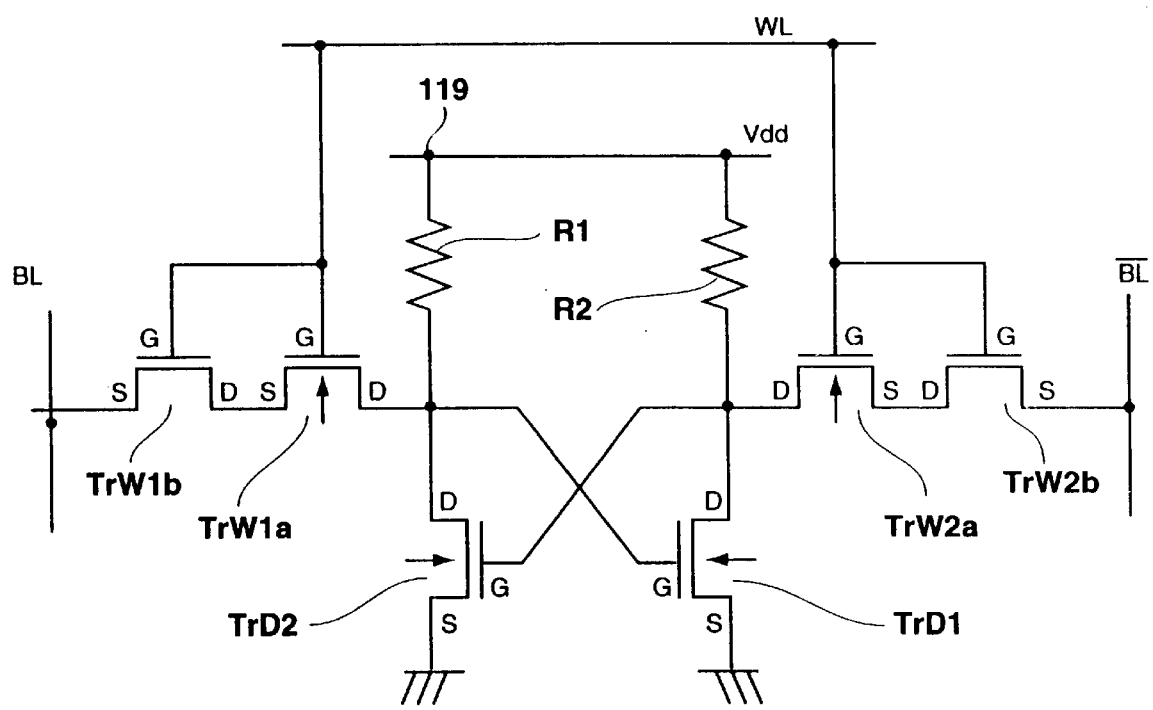
FIG. 7 is an equivalent circuit diagram of the memory cell indicated in FIG. 4.

FIG. 4 to FIG. 7 schematically illustrates a memory cell portion of an SRAM (static random access memory) device according to another embodiment of the present invention. In this embodiment, FIG. 4 is a plan view for transparently drawing the respective layers. FIG. 5 is a sectional view of the memory cell shown in FIG. 4, taken along a line A–A' of FIG. 4. Similarly, FIG. 6 is a sectional view thereof, taken along a line B–B' of FIG. 4. FIG. 7 is a circuit diagram for representing a memory cell portion of this SRAM device.

As represented in FIG. 5 and FIG. 6, element isolating regions 112a and 112b made of a silicon oxide film are selectively formed in a memory cell forming region of a silicon substrate 111. Also, trenches 113a and 113b having depths which do not exceed a depth of this element isolating region 112 are formed in a predetermined region in the silicon substrate 111 and the other element isolating regions 112a and 112b. A gate insulating film made of a silicon oxide film is selectively formed in inner side surfaces of trenches 113a and 113c of regions for forming word transistors TrW2a, TrW2b and a driver transistor TrD2.

As shown in FIG. 4 and FIG. 5, both a polysilicon side wall 116a functioning as a gate electrode of one word transistor TrW2a and another polysilicon side wall 116b functioning as a gate electrode of the other word transistor TrW2b are formed on the gate insulating film 114 of the both surfaces inside the trench 113a. Also, an impurity diffusion layer 115b functioning as a source-to-drain region of the word transistors TrW2a and TrW2b is formed near the surface of the silicon substrate 11 of the bottom portion of the trench 113. Adjacent to the surfaces of the silicon substrate 111 located on both sides of the trench 113a, an impurity diffusion layer 115a functioning as a source region of the word transistor TrW2b and another impurity diffusion layer 115c functioning as a drain region of the word transistor TrW2a are formed. In other words, as represented in FIG. 7, the word transistors TrW2 and TrW2b are directly connected to each other via another impurity diffusion layer 115b functioning as a source/drain region (source-to-drain region), and are ON/OFF-controlled by gate electrodes (polysilicon side walls 116a and 116b) functioning as a word line WL.

A polysilicon side wall 116d functioning as a gate electrode of the driver transistor TrD2 is formed on one inner side surface of the trench 113b, and another impurity diffusion layer 115d functioning as a drain region of the driver transistor TrD2 is formed near the surface of the silicon substrate 111 of the bottom surface portion of the trench 113b. Another impurity diffusion layer 115e functioning as a source region of the driver transistor TrD2 is formed near the surface of the silicon substrate 111 located adjacent to the trench 113b. The polysilicon side wall 116d is connected via the polysilicon side wall formed on the inner peripheral side surface of the trench 113b to another polysilicon layer 116c functioning as a gate electrode deriving layer of the driver transistor TrD2.

As illustrated in FIG. 4 and FIG. 6, a polysilicon side wall 116e functioning as a gate electrode of the word transistor TrW1a, and a polysilicon side wall 116f functioning a gate electrode of the word transistor TrW1b are formed on the gate insulating films 114 of the both surfaces inside the trench 113c.

Another polysilicon side wall 116h functioning as a gate electrode of the driver transistor TrD1 is formed on one inner side surface of the trench 113d, and another impurity diffusion layer 115i functioning as a drain region of the driver transistor TrD1 is formed near the surface of the silicon substrate 111 of the bottom surface portion of the trench 113d. Another impurity diffusion layer 115j functioning as a source region of the driver transistor TrD1 is formed near the surface of the silicon substrate 111 located adjacent to the trench 113d. The polysilicon side wall 116h is connected via the polysilicon side wall formed on the inner peripheral side surface of the trench 113d to another polysilicon layer 116g functioning as a gate electrode deriving layer of the driver transistor TrD1. It should be noted that the above-described polysilicon side wall 116a and polysilicon side wall 116b are constituted by the first layer of the polysilicon layers.

An interlayer insulating film 117 made of a planar-processing film such as BPSG (boron, phosphor, silicate, glass) is formed over the entire surface of the above-explained element structure so as to cover this entire surface. Contact holes 119a and 119d reaching the impurity diffusion layer 115a and the like, contact holes 119b and 119c reaching both the impurity diffusion layer 115c and the polysilicon layer 116c, and contact holes 119c and 119f reaching the impurity diffusion layer 115d and the like are formed in this interlayer insulating film 117. Then, the polysilicon layers 121a and 121e are formed so as to cover the contact holes 119a and 119d. The polysilicon layer 121b is formed in order to cover the contact holes 119b and 119f, and the polysilicon layer 121d is formed so as to cover the contact holes 119c and 119e. Also, the polysilicon layer 121c functioning as the ground line is formed in a central portion on the interlayer insulating film 117 within the memory cell. It should be understood that the above-described polysilicon layer 121a and the like are constructed of the second layer of the polysilicon layers.

The polysilicon layer 121b (see FIG. 5) is simultaneously connected to both the impurity diffusion layer 115c and the polysilicon layer 116c. This impurity diffusion layer 115c functions as a drain region of the word transistor TrW2, and the last-mentioned polysilicon layer 116c functions as a gate electrode deriving layer of the driver transistor TrD2. Furthermore, the polysilicon layer 121b is connected to the impurity diffusion layer 115i (see FIG. 6) functioning as a drain region of the driver transistor TrD1. Similarly, the polysilicon layer 121d (see FIG. 6) is simultaneously connected to both the impurity diffusion layer 115h and the polysilicon layer 116g. This impurity diffusion layer 115h functions as a drain region of the word transistor TrW1, and the last-mentioned polysilicon layer 116g functions as a gate electrode deriving layer of the driver transistor TrD1. Furthermore, the polysilicon layer 121d is connected to the impurity diffusion layer 115d (see FIG. 5) functioning as a drain region of the driver transistor TrD2.

Furthermore, an interlayer insulating film 122 made of a planar-processing film such as BPSG is formed on the entire surface of the above-described element structure so as to cover this element structure. Contact holes 123a and 123b reaching the polysilicon layer 121b are formed in this interlayer insulating film 122, and then the third layer of the polysilicon layers 125b and 125a is formed in order to cover these contact holes 123a and 123b, respectively. These polysilicon layers 125a and 125b constitute a power source line region (Vdd of FIG. 7) into which an impurity has been doped in high density, and a high resistance load element region (R1 and R2 of FIG. 7) into which an impurity has been doped in low density.

In addition, an interlayer insulating film 127 made of a planar-processing film such as BPSG is formed on the overall surface of the above-described element structure so as to cover this element structure. Contact holes 128a and 128b are formed in this interlayer insulating film 127 and another interlayer insulating film 122 located under this interlayer insulating film 127 in such a manner that these contact holes 128a and 128b may penetrate through these interlayer insulating films 127 and 122 and will reach the polysilicon layer 121a. plug layers 129a and 129b such as tungsten layers are buried into these contact holes 128a and 128b. Then, an aluminum layer 131a (bit bar line "BL" of FIG. 7) to be connected to the plug layer 129a, and another aluminium layer 131b (bit line "BC" of FIG. 7) to be connected to the plug layer 129b are formed on the interlayer insulating film 127. Thereafter, a surface protection film is formed on the entire surface of the above-described element structure so as to cover this element structure.

Referring now to FIG. 8 to FIG. 12, a method for manufacturing the SRAM device with the above-described structure will be explained.

First, as represented in FIG. 8A to FIG. 8C, a trench is formed in a predetermined portion of a memory cell forming region of the silicon substrate 111, and an insulating film such as a silicon oxide film is buried into this trench to thereby form the element isolating region 112a and 112b. It should be noted that FIG. 8B is a sectional view, taken a long a line A1 to A1' of FIG. 8A, and FIG. 8C is a sectional view, taken along a line C1 to C1' of FIG. 8A.

Next, as shown in FIG. 9A to FIG. 9C, after the silicon substrate 111 of the portion where the transistors are fabricated is selectively etched away, the element isolating region 112a and 112b of the portion where the transistors are fabricated is further etched away so as to form the trenches 113a–113c. It should be noted that the depth of this trench 113 does not exceed the depth of the element isolating region 112. FIG. 9B is a sectional view, taken along a line A2 to A2' of FIG. 9A, and FIG. 9C is a sectional view, taken along a line C2 to C2' of FIG. 9A.

Figure 10A:
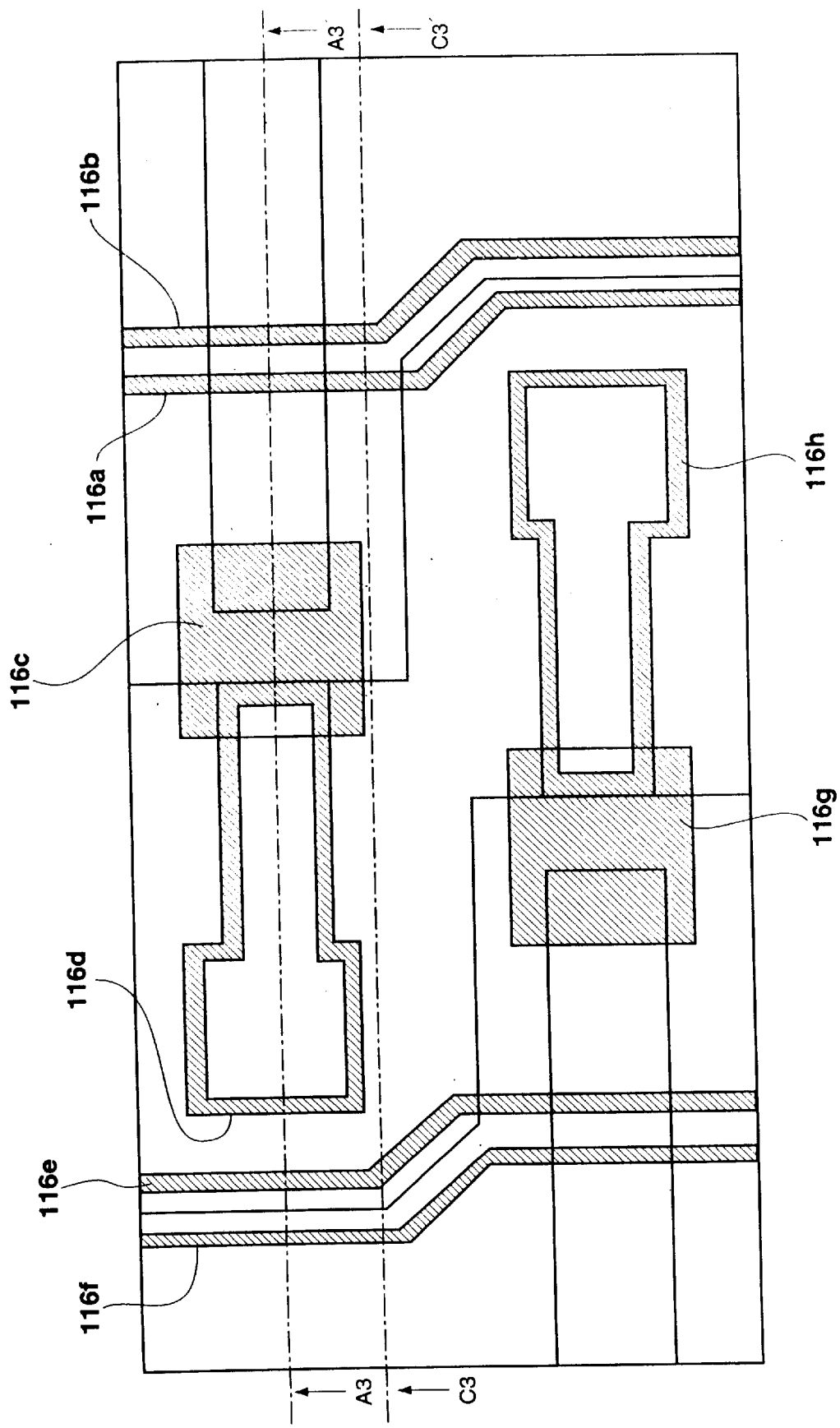
FIG. 10A is a plane overlapped diagram of the memory cell represented in FIG. 4 at a third step.

Next, as indicated in FIG. 10A to FIG. 10C, after the gate insulating film 114 made of a silicon oxide film has been formed on the transistor forming region, the impurity ions are selectively planted, so that the impurity diffusion layers 115a, 115c, 115e are formed on the surface of the silicon substrate 111, and the impurity diffusion layers 115b and 115d are formed on the bottom portions of the trenches 113a and 113b. It should be understood that the impurity diffusion layers 115a, 115b, 115c will constitute the drain-to-source regions of the two word transistors TrW2a and TrW2b series-connected to each other, whereas the impurity diffusion layers 115d and 115e will constitute the drain-to-source region of one driver transistor TrD2. It should also be noted that FIG. 10B is a sectional view, taken along a line A3–A3' of FIG. 10A, and FIG. 10C is a sectional view, taken along a line C3 to C3' of FIG. 10A.

Similarly, as shown in FIG. 10A to FIG. 10C, after the first layer of the polysilicon (polycrystal silicon) layers has been formed over the entire surface, the impurity is doped to thereby form a conductive layer. Then, a photoresist is formed on the region which will constitute the gate electrode of the driver transistor, and thereafter is processed by way of the anisotropic etching. As a result, the polysilicon side walls 116a and 116b are formed on both surfaces inside the trench 113a, the polysilicon side wall 116d is formed on the surface inside the trench 113b, and the polysilicon side walls 116e and 116f and formed on both surfaces inside the trench 113c. The polysilicon layer 116c connected to the polysilicon side wall 116d is formed on the gate electrode deriving portion of the driver transistor. In this case, the polysilicon side walls 116a and 116b will constitute the respective gate electrodes of the two word transistors TrW2a and TrW2b series-connected to each other, the polysilicon side wall 116d will constitute the gate electrode of one driver transistor TrD2, and also the polysilicon side walls 116e and 116f will constitute the gate electrodes of the two word transistors TrW1a and TrW1b series-connected to each other.

Figure 11A:
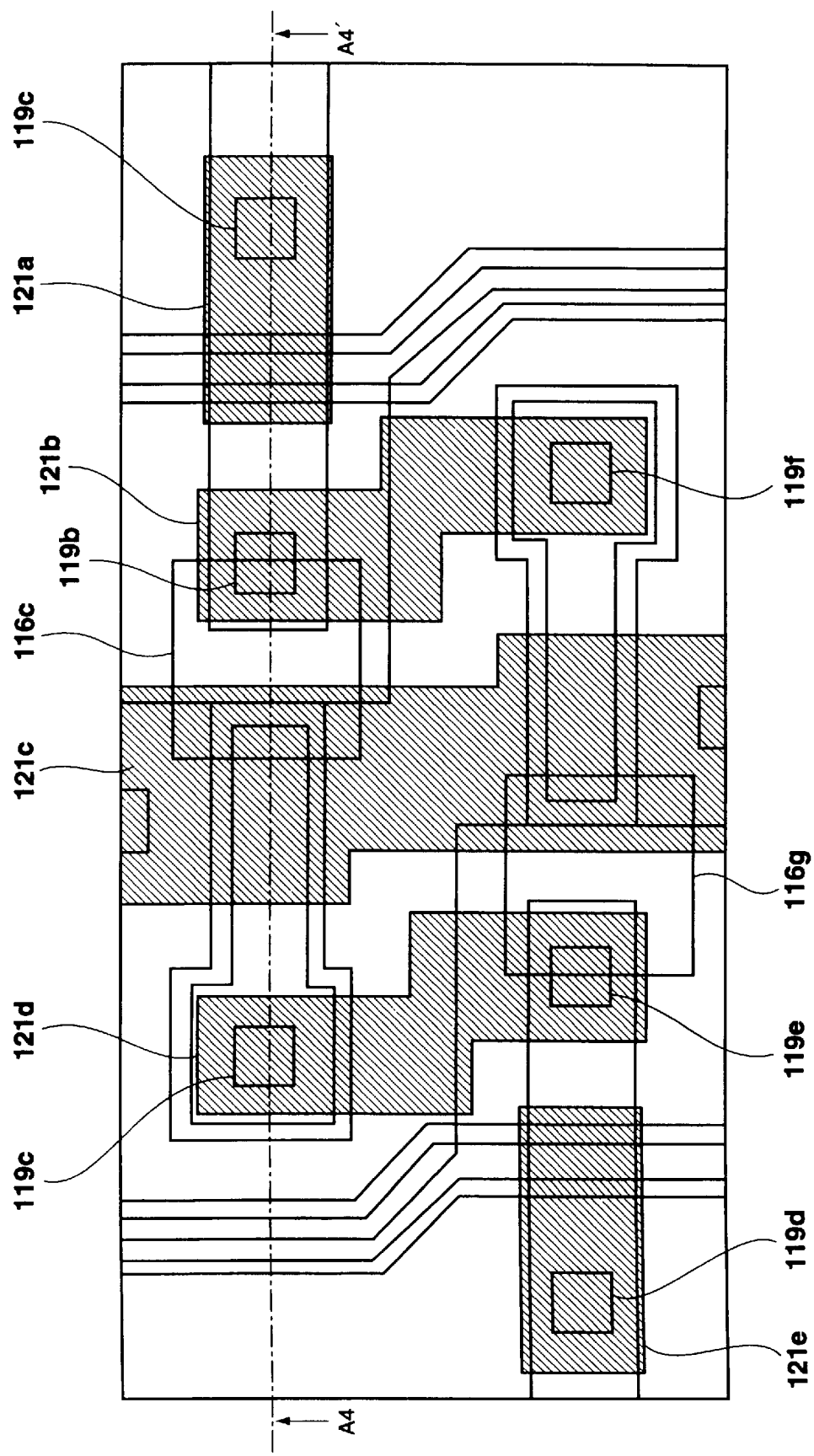
FIG. 11A is a plane overlapped diagram of the memory cell represented in FIG. 4 at a fourth step.

Next, as indicated in FIG. 11A and FIG. 11B, after the insulating film such as BPSG has been formed on the entire surface, the resultant film is planar-processed by the reflow process to thereby form the interlayer insulating film 117. Subsequently, the contact holes 119a and 119d reaching the impurity diffusion layer 115a, the contact holes 119b and 119e reaching both the impurity layer 115c and the polysilicon layer 116c, and the contact holes 119c and 119f reaching the impurity diffusion layer 115d are formed in this interlayer insulating film 117. Thereafter, the second layer of the polysilicon layers is formed on the entire surface, into which the impurity is doped to form the conductive layer. Then, the photoresist is formed on the region containing the contact holes 119a to 119f and the ground line forming portion, and thereafter the resultant portions with the photoresist are etched away to thereby form the polysilicon layers 121a to 121e. FIG. 11B is a sectional view, taken along a line A4–A4' of FIG. 11A.

In this case, the polysilicon layer 121a is employed so as to connect the source region (impurity diffusion layer 115a) of the word transistor TrW2b with the aluminium wiring layer 131a (bit bar line BL of FIG. 7). The polysilicon layer 121b is employed in order to simultaneously connect both the gate electrode deriving layer (polysilicon layer 116c) of the driver transistor TrD2 and the drain region (impurity diffusion layer 115c) of the word transistor TrW2a with a third layer of the polysilicon layers 125b (high resistance load element R2 of FIG. 7)(will be discussed later), and also to connect them with the drain region (impurity diffusion layer 115c of FIG. 6) of the other driver transistor TrD1. The polysilicon layer 121c will constitute the ground line. The polysilicon layer 121d is employed so as to connect the drain region (impurity diffusion layer 115d) of the driver transistor TrD2 with both the gate electrode deriving layer (polysilicon layer 116g of FIG. 6) of the other driver transistor TrD1 and the drain region (impurity diffusion layer 115h of FIG. 6) of the other word transistor TrW1a, and at the same time, to connect them to the third layer of the polysilicon layer 125a (high resistance load element R1 of FIG. 7). The polysilicon layer 121e is employed in order to connect the source region (impurity diffusion layer 115f of FIG. 7) of the word transistor TrW1b with the aluminium wiring layer 131b (bit line BL of FIG. 7).

Figure 12B:
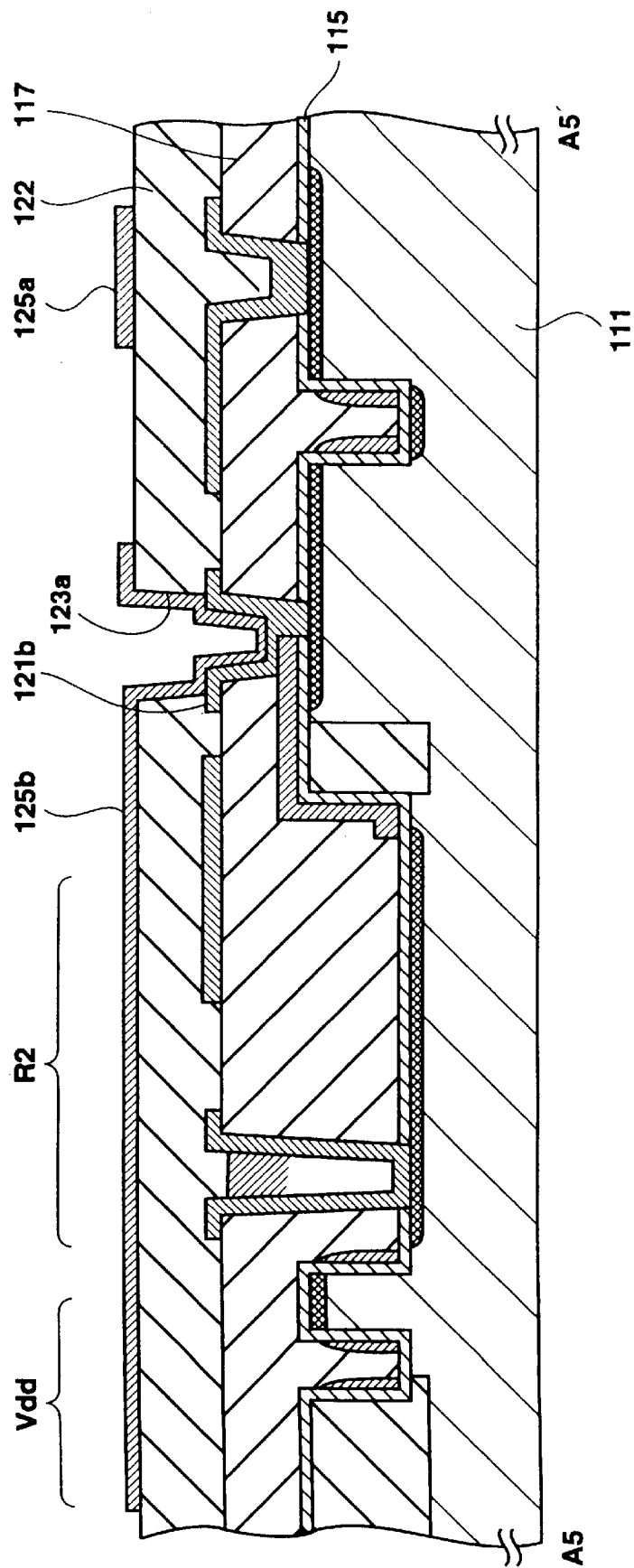
FIG. 12B is a sectional view for showing the memory cell, taken along a line A5 to A5' of FIG. 12A.

Next, as represented in FIG. 12A to FIG. 12B, after the insulating film such as BPSG has been formed on the entire surface, this resultant film is planar-processed by way of the reflow process to thereby the interlayer insulating film 122. Subsequently, the contact hole 123a reaching the polysilicon layer 121b is formed on this interlayer insulating film 122, and thereafter the third layer of the polysilicon layers is formed over the entire surface, which is selectively etched away to thereby form the polysilicon layers 125a and 125b. Furthermore, the impurity is selectively doped into the polysilicon layer 125b to thereby form the power supply line Vdd (FIG. 7), and then the polysilicon layer 125b between this power supply line and the second layer of the polysilicon layers 121b will constitute the high resistance load element R2 (FIG. 7). Similarly, the impurity is selectively doped into the polysilicon layer 125a to thereby form the power supply line Vdd (FIG. 7), and then the polysilicon layer 125a between this power supply line and the second layer of the polysilicon layers 121d will constitute the high resistance load element R1 (FIG. 7). It should be understood that FIG. 12B is a sectional view, taken along a line A5 to A5' of FIG. 12A.

Subsequently, as indicated in FIG. 4, FIG. 5 and FIG. 6, after the insulating film such as BPSG has been formed over the entire surface, the resultant film is planar-processed by way of the reflow process to thereby form the interlayer insulating film 127. Next, after the contact hole 128a which penetrates through the interlayer insulating films 127 and 122 and then reaches the polysilicon layer 121a, and the contact hole 28b reaching the polysilicon layer 121e have been formed, these contact holes 128a and 128b are buried by the plug layers 129a and 129b made of the tungsten layers and the like. Then, the aluminium wiring layer is formed on the plug layers, and then is patterned, so that the aluminium wiring layer 131a(bit bar line BL of FIG. 7) to be connected to the plug layer 129a, and the aluminium wiring layer 131b (bit line BL of FIG.7) to be connected to the plug layer 129b are fabricated. Thereafter, the surface protection film is formed over the entire surface, so that the manufacturing steps of this SRAM device are accomplished.

As previously described, according to this embodiment, since the gate electrodes of the word transistor and the driver transistor are formed in the inner surfaces of the trench, even when the channel width (gate width) of the driver transistor is made wide, the size of the memory cell is not so increased, as compared with the conventional plane element structure. As a consequence, if the current driveability ratio substantially equal to the conventional current driveability is maintained, the element area of the driver transistor can be extremely reduced, as compared with the conventional element area, and also the integration degree of the memory cell can be increased. Conversely, in the case that the element integration degree of the memory cell of the present invention is kept equal to the conventional element integration degree, the current driveability of the driver transistor with respect to that of the word transistor is sufficiently increased, and the noise margin can be improved. Also, since both the word transistor and the driver transistor are formed in the inner surfaces of the trench, even if the depth of the trench is fluctuated by executing the etching treatment, there is a small fluctuation in the current driveability ratio, and the stable drive characteristic can be obtained.

It should be noted that although this embodiment has described the SRAM device with employment of the polysilicon resistor into which no impurity is doped as the high resistance load element, the present invention is not limited thereto, but may be applied to other SRAM devices. For instance, the present invention may be applied to an SRAM device with using a TFT(thin-film transistor) and the like as a load element, or a complete CMOS type SRAM device.

What is claimed is:

1. A semiconductor memory comprising:
   a recess formed in a semiconductor substrate;
   a drain diffusion of a drive transistor formed under a surface of said recess;
   a gate electrode formed around a side of the recess;
   a drain diffusion of a word transistor formed under a surface of said semiconductor substrate adjacent said recess; and a conductive structure beginning at a base of said recess extending upward to the drain diffusion of the word transistor which electrically connects the drain diffusion of the word transistor to the drain diffusion of the drive transistor.

2. The semiconductor memory of claim 1, wherein the drain diffusion of the drive transistor is formed exclusively under the recess.

3. The semiconductor memory of claim 2, wherein the drain diffusion of the drive transistor is connected to the gate of another drive transistor through a connection formed through the recess and the drain diffusion of said another drive transistor is connected to the gate on the side of the recess.

4. A static random access memory comprising:

trenches formed in a semiconductor substrate and an insulating layer for isolating elements within a memory cell forming region wherein said insulating layer for isolating elements separates adjacent trenches and further wherein a depth of the trenches does not exceed a depth of the insulating layer;

one pair of word transistors;

one pair of driver transistors for constituting a flip-flop by forming channel regions of said driver transistors in side surfaces of said trenches and by cross-connecting gate electrodes thereof and drain electrodes thereof to each other at one pair of input/output terminals of said flip-flop; and one pair of word transistors connected between said one pair of input/output terminals of said flip-flop and a bit line.

5. A static random access memory as claimed in claim 4 wherein:

a drain of said driver transistor formed in a bottom portion of said trench, and a source of said driver transistor formed in a major surface of said semiconductor substrate located adjacent to said trench.

6. A static random access memory as claimed in claim 4 wherein:

the gate electrodes of said one pair of driver transistors are formed by a first layer wiring pattern.

7. A static random access memory as claimed in claim 4 wherein:

said flip-flop is formed by a second layer of wiring patterns which are cross-connected to each other.

8. A static random access memory as claimed in claim 4 wherein:

depths of said trenches are made in such a manner that said depths do not exceed a depth of said elements isolating insulating layer, and gate electrodes of said driver transistors are formed via gate insulating layers on side surfaces of said trenches.

9. A static random access memory as claimed in claim 4 wherein:

channel regions of said word transistors are formed in the side surfaces of said trenches.

10. A static random access memory as claimed in claim 9 wherein:

said word transistors are constituted by series-connecting two transistors with each other, in which an impurity diffusion layer is commonly used as a source-to-drain region and is formed in a bottom portion where said driver transistors are formed, and conductive layers are used as the respective gate electrodes and are formed via a gate insulating layer on both side surfaces of the trenches of said portion.

11. A static random access memory as claimed in claim 9 wherein:

gate electrodes of said driver transistors and the gate electrodes of said word transistors are formed at the same step.

* * * * *